US008206892B2

(12) United States Patent
Keszler et al.

(10) Patent No.: US 8,206,892 B2
(45) Date of Patent: Jun. 26, 2012

(54) SOLUTION PROCESSED THIN FILMS AND LAMINATES, DEVICES COMPRISING SUCH THIN FILMS AND LAMINATES, AND METHOD FOR THEIR USE AND MANUFACTURE

(75) Inventors: Douglas A. Keszler, Corvallis, OR (US); Jeremy Anderson, Corvallis, OR (US); Jason K. Stowers, Corvallis, OR (US)

(73) Assignee: State of Oregon, Corvallis, OR (US), acting by and through the State Board of Higher Education on Behalf of Oregon State University ( * ) Notice: Subject to any disclaimer, the term of this patent is extended or adjusted under 35 U.S.C. 154(b) by 22 days.

(21) Appl. No.: 12/836,492

(22) Filed: Jul. 14, 2010

(65) Prior Publication Data
US 2011/0045406 A1   Feb. 24, 2011

Related U.S. Application Data

(63) Continuation of application No. 12/286,606, filed on Sep. 30, 2008, which is a continuation-in-part of application No. PCT/US2007/023084, filed on Oct. 31, 2007.

(60) Provisional application No. 60/856,070, filed on Nov. 1, 2006, provisional application No. 61/070,943, filed on Mar. 25, 2008.

(51) Int. Cl.
*G03F 7/00* (2006.01)
*G03F 7/004* (2006.01)
*G03F 7/028* (2006.01)
*G03F 7/20* (2006.01)

(52) U.S. Cl. .............. 430/270.1; 430/322; 430/325; 430/326; 430/942; 430/913

(58) Field of Classification Search ............... 430/270.1, 430/942, 913, 322, 325, 326
See application file for complete search history.

(56) References Cited

U.S. PATENT DOCUMENTS
3,385,915 A    5/1968   Hamling
(Continued)

FOREIGN PATENT DOCUMENTS
JP   2007035232 A  *  2/2007
(Continued)

OTHER PUBLICATIONS
Kukli et al, "Atomic Layer Deposition of Zirconium Oxide From Zirconium Tetraiodide, water, and Hydrogen Peroxide", Journal of Crystal Growth 231 pp. 262-272 (2001).*
(Continued)

*Primary Examiner* — Amanda C. Walke
(74) *Attorney, Agent, or Firm* — Klarquist Sparkman, LLP

(57) ABSTRACT

Devices having a thin film or laminate structure comprising hafnium and/or zirconium oxy hydroxy compounds, and methods for making such devices, are disclosed. The hafnium and zirconium compounds can be doped, typically with other metals, such as lanthanum. Examples of electronic devices or components that can be made include, without limitation, insulators, transistors and capacitors. A method for patterning a device using the materials as positive or negative resists or as functional device components also is described. For example, a master plate for imprint lithography can be made. An embodiment of a method for making a device having a corrosion barrier also is described. Embodiments of an optical device comprising an optical substrate and coating also are described. Embodiments of a physical ruler also are disclosed, such as for accurately measuring dimensions using an electron microscope.

23 Claims, 22 Drawing Sheets

U.S. PATENT DOCUMENTS

| | | | |
|---|---|---|---|
| 5,025,094 | A | 6/1991 | King |
| 6,040,372 | A * | 3/2000 | Watanabe et al. ............. 524/413 |
| 6,183,716 | B1 | 2/2001 | Sleight et al. |
| 6,197,896 | B1 | 3/2001 | Aviram et al. |
| 6,583,071 | B1 | 6/2003 | Weidman et al. |
| 6,844,604 | B2 * | 1/2005 | Lee et al. ...................... 257/410 |
| 6,927,108 | B2 | 8/2005 | Weng et al. |
| 6,946,677 | B2 | 9/2005 | Ostergard |
| 6,949,178 | B2 * | 9/2005 | Tennakoon et al. ........... 205/439 |
| 7,175,962 | B2 * | 2/2007 | Kouchiyama et al. ..... 430/270.1 |
| 7,208,341 | B2 | 4/2007 | Lee et al. |
| 7,465,530 | B1 * | 12/2008 | Chen et al. ................. 430/270.1 |
| 7,572,695 | B2 * | 8/2009 | Ahn et al. ...................... 438/240 |
| 7,718,478 | B2 * | 5/2010 | Arao ............................. 438/151 |
| 7,773,365 | B2 * | 8/2010 | Herman et al. ............ 361/321.1 |
| 2005/0242330 | A1 * | 11/2005 | Herman et al. ............... 252/570 |
| 2006/0088962 | A1 | 4/2006 | Herman et al. |
| 2008/0261410 | A1 * | 10/2008 | Yang et al. .................... 438/761 |
| 2008/0286683 | A1 | 11/2008 | Brodsky et al. |
| 2010/0044698 | A1 | 2/2010 | Herman et al. |
| 2011/0045406 | A1 | 2/2011 | Keszler et al. |

FOREIGN PATENT DOCUMENTS

| | | | |
|---|---|---|---|
| JP | 2007-182605 A | | 7/2007 |
| JP | 2008046513 A | * | 2/2008 |
| JP | 2009252323 A | * | 10/2009 |
| WO | WO 2008/082448 | | 7/2008 |
| WO | WO 2009/120169 | | 10/2009 |

OTHER PUBLICATIONS

International Search Report and Written Opinion dated May 15, 2008, from International Application No. PCT/US07/023084.

International Search Report and Written Opinion dated Jun. 26, 2008, from International Application No. PCT/US08/004096.

Ahmed et al., "Synthesis and Characterization of Zirconium and Hafnium Sulfates, Hydroxide Sulfates and Oxide Sulfates," Acta Chemica Scandinavica, 53:24-33 (1999).

International Standard ISO 21348 "Space Environment (natural and artificial)—Process for determining solar irradiances," First Edition 2007, Reference No. ISO 21348:2007(E) (20 pages).

Stowers, "Direct Patterning of Solution Deposited Metal Oxides," A Dissertation to Oregon State University, Aug. 14, 2008 (149 pages).

Stowers et al., "High resolution, high sensitivity inorganic resists," Microelectronic Engineering, 86:730-733 (2009).

Zhang et al., "Stabilization of Cubic ZrO2 with Rh(III) and/or La(III)," Journal of Solid State Chemistry, 72:131-136 (1988).

Zimmerman, "Extension Options for 193nm Immersion Lithography," Journal of Photopolymer Science and Technology, 22(5):625-634 (2009) (Abstract), for full article please see http://www.jstage.jst.go.jp/article/photopolymer/22/5/625/_pdf.

Japanese Office Action dated Mar. 27, 2012, from Japanese Patent Application No. 2011-501756 (with English-language Summary).

* cited by examiner

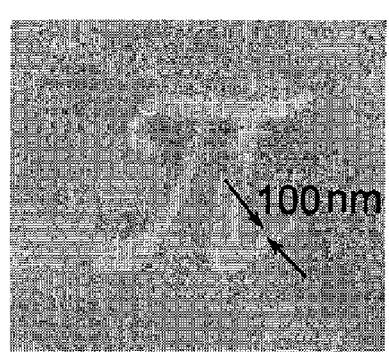
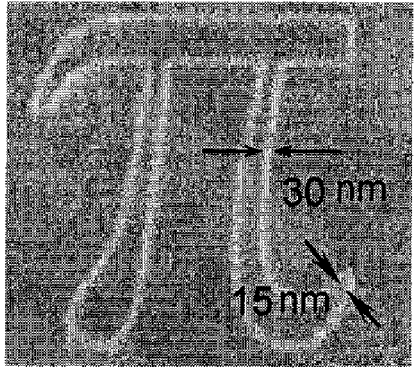
FIG. 35          FIG. 36
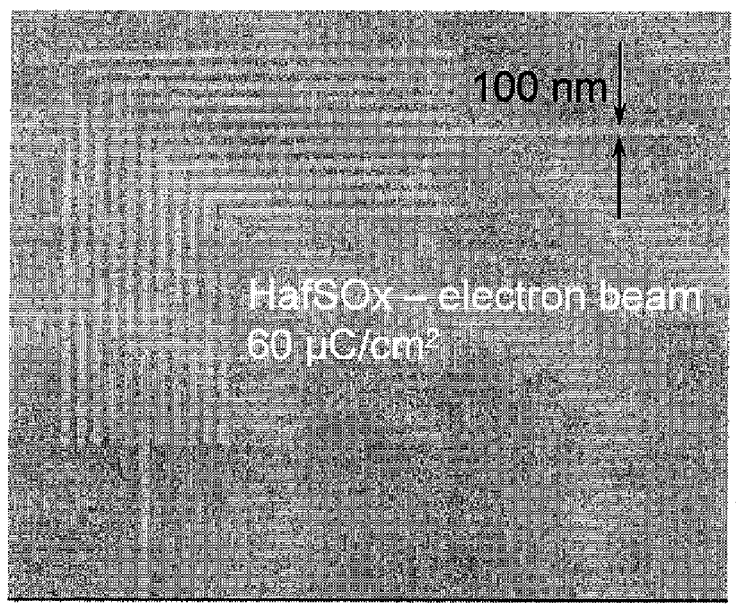
FIG. 37

SOLUTION PROCESSED THIN FILMS AND LAMINATES, DEVICES COMPRISING SUCH THIN FILMS AND LAMINATES, AND METHOD FOR THEIR USE AND MANUFACTURE

CROSS REFERENCE TO RELATED APPLICATIONS

This application is a continuation of U.S. patent application Ser. No. 12/286,606, filed on Sep. 30, 2008, which is a continuation-in-part of international application No. PCT/US2007/023084, filed on Oct. 31, 2007, which claims the benefit of the earlier filing date of U.S. provisional application No. 60/856,070, filed on Nov. 1, 2006. U.S. application Ser. No. 12/286,606 also claims the benefit of the earlier filing date of U.S. provisional application No. 61/070,943, filed on Mar. 25, 2008. Each of these prior applications is incorporated in its entirety herein by reference.

ACKNOWLEDGMENT OF GOVERNMENT SUPPORT

This invention was made with government support under grant number HR0011-06-1-0045 awarded by DARPA. The government has certain rights in the invention.

FIELD

The present disclosure concerns embodiments of features and devices comprising inorganic metal oxide materials useful for creating spatially-defined structures for purposes including electronic and optical applications, and embodiments of methods for their manufacture and use.

BACKGROUND

Electronic devices currently are made using iterative process steps, such as sequential deposition and etching of materials. For devices comprising inorganic materials, metal-organic precursors have been used extensively for solution-based deposition of inorganic oxides. The presence of the organic moiety necessitates a high-temperature burnout step to remove the organic material. This step can cause significant volume change, crystallization and the phenomenon of "mud cracking." The associated defects inhibit the performance of these materials as coatings and within devices.

Methods for solution processing materials for electronic device applications have been patented. For example, Ostergard, U.S. Pat. No. 6,946,677, entitled "Pre-Patterned Substrate for Organic Thin Film Transistor Structures and Circuits and Related Method for Making Same," describes forming a desired circuit configuration in the surface of a substrate, thereby pre-patterning the area to receive material useful for forming an organic thin film transistor (OTFT) structure and interconnecting conductive paths. According to the '677 patent, OTFT material is deposited in the pre-patterned area using printing techniques such as inkjet printing.

Weng et al., U.S. Pat. No. 6,927,108, describes solution processing thin-film materials to form transistors. The '108 patent describes forming "conductive solution-processed thin film material contacts, semiconductor solution-processed thin film material active regions, and dielectric solution-processed thin film material isolations in a sequence and organization to form a solution-processed thin film structure capable of transistor operation."

U.S. Patent Publication No. 2005/0242330 A1, which is incorporated herein by reference, concerns hafnium and zirconium compounds useful for electronic applications. U.S. Patent Publication No. 2005/0242330 A1 names Dr. Douglas Keszler as an inventor, who also is an inventor of embodiments disclosed herein.

SUMMARY

U.S. Patent Publication No. 2005/0242330 A1 discloses compounds and solution deposition of inorganic compounds in a manner that addresses deficiencies of prior technologies. For example, solution deposition according to the present invention avoids using organic materials required for metal-organic deposition techniques, and hence also avoids organic burnout and the cracking problems associated with burnout.

One embodiment of the present invention concerns devices, such as electronic devices, having a thin film or laminate structure comprising at least one hafnium and/or zirconium oxy hydroxy sulfate $(MO_{2-x-z/2}(OH)_z(SO_4)_x)$ compound, hafnium and/or zirconium oxy hydroxy tungstate $(MO_{2-x-z/2}(OH)_z(WO_4)_x)$ compound, hafnium and/or zirconium oxy hydroxy borate $(MO_{2-3x/2-z/2}(OH)_z(BO_3)_x)$ compound, hafnium and/or zirconium oxy hydroxy phosphate $(MO_{2-3x/2-z/2}(OH)_z(PO_4)_x)$ compound, and/or hafnium and/or zirconium oxy hydroxy silicate $(MO_{2-2x-z/2}(OH)_z(SiO_4)_x)$ compound, where M is hafnium or zirconium, x and z may be fixed or variable. X may have any value in a range of from about 0.1 to about 3.5/(polyatomic ion charge). For example, x may be any value within the range of from about 0.1 to about 1.75 for a polyatomic ion with a charge of 2, such as the oxy hydroxy sulfate compounds. Z may have any value range within the range of from 0.0 to about 3.8.

Particular embodiments concern thin films or laminates comprising a hafnium or zirconium oxy hydroxy sulfate compound having a formula $(MO_{2-x-z/2}(OH)_z(SO_4)_x)$, wherein M is hafnium or zirconium, x and z may be fixed or variable, and have any value for x in a range of from about 0.1 to about 1.75, and any value for z in a range of from 0.0 to about 3.8. These compounds also are referred to as HafSOx and ZircSOx. The hafnium and zirconium compounds also can be doped, typically with other metals, such as calcium, cerium, lanthanum, or combinations thereof. Certain embodiments have used lanthanum as a dopant to produce compounds having a formula $M_{1-x}La_yO_{2-x-z/2-y/2}(OH)_z(SO_4)_x$ (MSOx:La), where the composition and stoichiometry are as stated above. A particular example of a lanthanum-doped compound is $Hf_{0.68}La_{0.32}O_{1.48}(SO_4)_{0.36}$. Additional exemplary compounds include HafSOx:La, ZircSOx:La, HafSOx:Ce, or ZircSOx:Ca. In certain embodiments, sulfate is subsequently removed via ion exchange with an aqueous base, resulting in $M(OH)_x$ or $MO_x$ films. Suitable aqueous bases include group I metal hydroxides, group II metal hydroxides, group III metal hydroxides, lanthanide hydroxides, ammonium hydroxide, and/or aqueous tertiary amines, among others. The absence of organic components in the $M(OH)_x$ allows the unique conversion and dehydration to metal oxide $MO_x$ at low temperatures, using any suitable technique, such as via microwave and lamp drying or by laser processing.

Certain embodiments concern thin oxide films or laminates comprising complex compositions with two or more metals. At least one of the metal cations has a charge greater than or equal to $3^+$, and the total concentration of cations with charge greater than or equal to $3^+$ exceeds 50 mol % of the metal cations in the target oxide. A non-aqueous solution comprising dissolved salts and an amount of water is prepared. The amount of water is less than 20 mol % relative to the non-aqueous solvent. The pH of the solution is increased relative to the starting solution by adding a base or by reaction of free protons via oxidation-reduction mechanisms. The final solution pH depends upon the metal cations used, but will typically be in the range of about 2-9. The increased pH results in hydrolysis of water molecules bound to the cations and condensation of these resulting hydroxo-cations. The solvent is evaporated, and the resulting solid is dissolved or dispersed in water and subsequently applied to a substrate as a liquid film. The liquid film is then thermally cured at a temperature between about 100° C. and 600° C. for about 5-240 minutes.

Examples of electronic devices, or components of devices, that can be made according to this invention include, without limitation, insulators, such as a gate insulator in a field effect transistor, transistors, such as a field effect transistor, and capacitors, such as a MIM capacitor. Thin films and laminates made according to this embodiment had a permittivity value within the range of from about 9 to about 12, a breakdown field from at least 3 MV cm$^{-1}$ up to about 6 MV cm$^{-1}$, and a leakage current near 1 nA cm$^{-2}$ at field strengths of 1 MV cm$^{-1}$. Devices made using ZircSOx:Ca had a breakdown field of about 3.6 MV cm$^{-1}$, and a leakage current of less than about 50 nA cm$^{-2}$, more typically less than about 10 nA cm$^{-2}$.

Field effect transistors can be made using HafSOx:La and/or ZircSOx:La as gate dielectric materials. Certain disclosed embodiments used zinc indium oxide and/or zinc tin oxide as channels. Particular field effect transistors had an on-to-off ratio of greater than 10$^6$, and nA cm$^{-2}$ gate leakage currents.

Another embodiment of the present invention concerns a method for patterning a device using an inorganic photoresist. A particular embodiment of the method comprises first providing a structure to be patterned. The structure typically comprises: a substrate, such as a semiconductor material, a metal, glass, a polymeric material, or combinations thereof; a material layer for patterning, such as silica; and a resist layer. The resist layer typically includes disclosed hafnium and/or zirconium oxy hydroxy compounds. The structure is exposed to an energy source, such as an electron beam or light, with particular examples using ultraviolet light. Thereafter, material is removed to pattern the device, or it is retained as an active, patterned component of the device.

The resist may be a positive resist or a negative resist. For example, the method can include exposing the resist layer to an energy source to convert the resist layer material into a developer-soluble material. The developer-soluble material is then removed using a developer. Suitable developers may include acids, bases, and/or ultrasonic agitation, among others. Again by way of example, the method can comprise removing resist layer material exposed to the energy source. Without limiting the invention to a particular theory of operation, at least for certain embodiments, exposure to the energy source may cause the resist layer to polymerize, making it relatively less soluble in a developer than prior to exposure to the energy source.

One embodiment of a positive resist comprises a bilayer. A first layer of the bilayer comprises a copper formate film deposited on a hafnium oxide sulfate (HafSOx) film. The copper formate film is soluble in acid and the undoped HafSOx film is insoluble in acid. Exposing the bilayer to light through a mask or to a focused electron beam causes the two films to interdiffuse in exposed areas, thereby rendering the previously undoped HafSOx film soluble.

Another embodiment of a bilayer process for making a resist comprises depositing a first layer of a solid acid or base, where the acid or base contains one or more metal atoms, onto a substrate. A liquid suspension containing an oxide precursor, such as copper formate, is applied in a desired pattern onto the first layer. Under heated conditions, the precursor decomposes to an oxide. The oxide subsequently reacts and interdiffuses with the first layer, forming a product that can be etched to reveal a pattern. An alternate embodiment comprises depositing oxide particles onto the first layer, with or without heating, resulting in a direct reaction to form a product that can be etched. A further embodiment comprises depositing a thin layer of the oxide precursor onto the first layer. A pattern of activated precursor is then formed by light exposure through a photomask or direct writing with a focused laser or electron beam.

Another embodiment of the present invention concerns a master plate for imprint lithography. The master plate comprises a substrate, such as a flexible or glass substrate, and at least one layer of a thin film or laminate structure comprising at least one disclosed hafnium and/or zirconium oxy hydroxy compound. A particular embodiment of a master plate includes a layer of HafSOx deposited onto the substrate, and a second layer, such as a ZircSOx:Cu layer. The master plate may be patterned by exposure to an energy source, such as exposure to light or an electron beam through a mask to cause the two films to interdiffuse in exposed areas. This renders previously undoped HafSOx film soluble, which is removed to at least partially define printing features of the master plate.

In another embodiment, masks or templates can be fabricated using the films of the present invention in a single layer process. A thin film of an inorganic precursor, such as a solid acid or base, is deposited onto a substrate in combination with a peroxide or similar anion. The film is heated to produce a structurally rigid film. It is then exposed through a photomask or via a laser or electron beam to induce condensation/crosslinking in exposed areas. The solubility of the exposed areas decreases relative to the unexposed areas. The unexposed areas can then be selectively etched, producing a negative-tone image in the film. Positive-tone images also can be formed by preheating the film to higher temperatures before exposure. In some embodiments, an $M(OH)_x/H_2O_2$ film is formed by treating a film such as HafSOx with a mixture of sodium hydroxide and hydrogen peroxide. The resulting film is then patterned by exposure to light or an electron beam.

A method for forming a device also is described, comprising providing a structure to be patterned comprising a substrate, a material layer for patterning, and a metal oxide layer comprising disclosed hafnium and/or zirconium oxy hydroxy compounds. The structure is patterned and then exposed to an energy source to form a durable material having a desired pattern produced by patterning the structure. One embodiment of a device made according to the method can include a channel array, such as a micro- or nano-channel array. For such embodiments, the method for making the device can include stamping unit features of a desired size scale into a semi-solid hafnium or zirconium compound to form a stamped layer.

An embodiment of a method for making a device having a corrosion barrier also is described. Disclosed embodiments of the method comprise providing a device, and forming at least one corrosion barrier on the device. The corrosion barrier typically comprises a metal oxide layer comprising disclosed hafnium and/or zirconium oxy hydroxy compounds. The method also can include exposing the compound to an energy source to form the corrosion barrier. Examples of such devices include metal and metal/ceramic-based thermal protection systems, organic-based displays and electronics, solar cells, high emissivity coatings, interface coatings for oxide-based ceramic matrix systems, protective coatings on phosphors, environmental barrier coatings for metal and ceramic-based systems, fibers for composites and fiber lasers, corrosion protection in molten metal processing, monolithic materials for thermal insulation, and catalyst supports.

An embodiment of a method for forming fibers also is disclosed. A solution is formed comprising disclosed hafnium and/or zirconium oxy hydroxy compounds. The solution is then drawn into fibers. The fibers may be converted into solid, stable forms by any suitable process, such as hydrolysis, annealing, air pyrolysis, and combinations thereof.

Embodiments of an optical device also are described. Particular disclosed embodiments of the device comprise an optical substrate, and a substrate coating comprising disclosed hafnium and/or zirconium oxy hydroxy compounds. The layer may be an antireflective coating. The optical substrate and coating may define, for example, a dielectric mirror, an X-ray mirror, an interference filter, a diffractive grating, and/or a waveguide. The optical device also may include a layer that is transparent, such as visibly transparent or transparent to ultraviolet light. The layer may be selectively doped to provide a doped layer having luminescent ions selected from $Mn^{2+}$, $Sb^{3+}$, $Sn^{2+}$, $Bi^{3+}$, $Eu^{3+}$, $Tb^{3+}$, $Eu^{2+}$, $Gd^{3+}$, $Tm^{3+}$, and combinations thereof. Doping the layer can be used to produce a light-emitting layer.

Embodiments of a method for making a physical ruler also are disclosed. Certain embodiments comprise forming at least one acid-soluble layer by solution deposition of disclosed hafnium and/or zirconium oxy hydroxy compounds. At least one acid-insoluble layer is formed adjacent to the acid-soluble layer, the acid-insoluble layer being formed by solution deposition of disclosed hafnium and/or zirconium oxy hydroxy compounds. Repeating these steps produces alternating layers, and the method includes accurately determining widths of alternating acid-insoluble and acid-soluble layers. Width determination can be accomplished using any suitable method, such as X-ray reflectivity. Moreover, at least one layer is etched to define a digitated secondary reference pattern for measuring objects. Certain embodiments of such a device are useful for accurately measuring dimensions using an electron microscope.

The foregoing and other objects, features, and advantages of the invention will become more apparent from the following detailed description, which proceeds with reference to the accompanying figures.

BRIEF DESCRIPTION OF THE DRAWINGS

FIG. 35 is a $HfO_{2-x}(SO_4)_x$ film patterned by an electron beam.

FIG. 36 is a $HfO_{2-x}(SO_4)_x$ film patterned by an electron beam.

FIG. 37 is a $HfO_{2-x}(SO_4)_x$ film patterned by an electron beam.

DETAILED DESCRIPTION

Disclosed embodiments of the present invention concern devices, including electronic devices or components of electronic devices, which can be made by solution deposition of inorganic materials. Throughout this disclosure, the singular terms "a," "an," and "the" include plural referents unless the context clearly indicates otherwise. Similarly, the word "or" is intended to include "and" unless the context clearly indicates otherwise. The term "includes" means "comprises." All percentages recited herein are atomic percentages unless indicated otherwise. All patents and publications mentioned herein are incorporated by reference in their entirety, unless otherwise indicated. In case of conflict, the present specification, including explanations of terms, will control. The materials, methods, and examples recited herein are illustrative only and are not intended to be limiting.

I. Metal oxide sulfate materials generally and u.s. Patent publication no. 2005/0242330 A1

The present disclosure concerns embodiments of a method for solution deposition of inorganic materials, typically solution deposition of metal oxide sulfate inorganic materials that are useful for electronic applications. Embodiments of these materials are described in U.S. Patent Publication No. 2005/0242330 A1. Certain portions of that published application, from paragraph 009 through paragraph 014, are paraphrased below. References to figures in this paraphrased text refer to the figures as published with the '330 publication.

Figure 1:
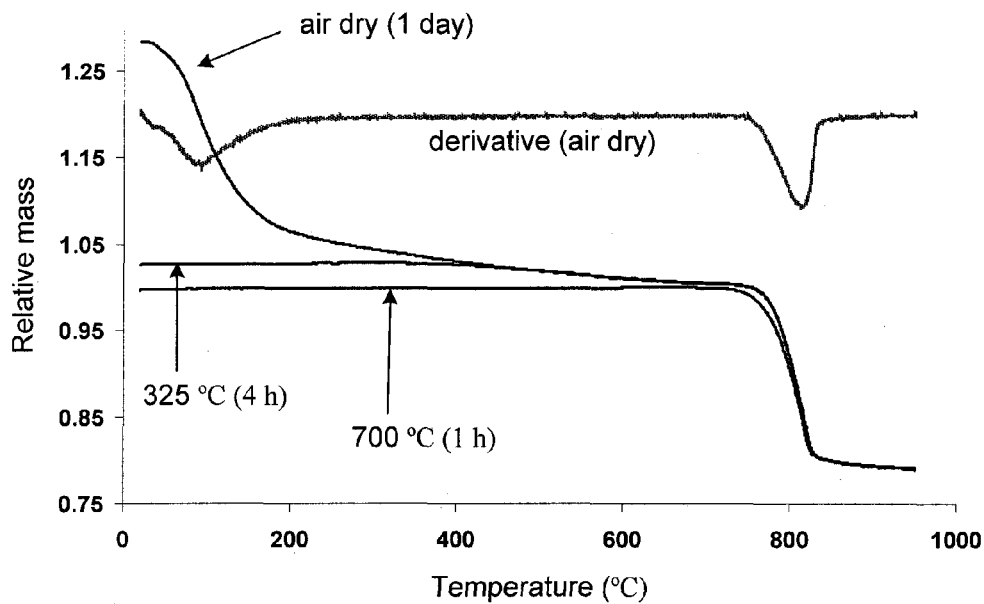
FIG. 1 provides thermogravimetric analysis (relative mass versus temperature) (TGA) for HafSOx (x=0.70) with various pretreatments and with samples heated under flowing $N_2(g)$ at a rate of 10° C. minute$^{-1}$.

FIG. 1 illustrates one embodiment of a process for manufacturing a dielectric precursor material. Process 10 generally comprises providing a first reactant 12, such as a metal-containing cation, providing a second reactant 14, such as a polyatomic anion, and then reacting the polyatomic anion and the metal-containing cation. The metal-containing cation and the polyatomic anion may be in solution, such as an aqueous solution, when reacted together. In one embodiment, the metal-containing cation may be provided using an aqueous solution of a hafnium oxy halide, such as hafnium oxy chloride (HfOCl$_2$(aq)). The polyatomic anion, such as sulfate (SO$_4^{2-}$), may be provided using an aqueous solution of sulfuric acid (H$_2$SO$_4$(aq)). These two reactants may be mixed together using processes and relative amounts suitable for making desired materials. The mixture may be heated.

The reaction may produce a precursor solution 16. Precursor solution 16 may be immediately used as desired, such as by being applied to a substrate. Optionally, precursor solution 16 may be at least partially dehydrated and then applied. In the example given above, the precursor solution may then form hafnium oxy-hydroxy sulfate (HfO$_{2-x-z/2}$(OH)$_z$(SO$_4$)$_x$). With reference to the variables in this formula, x and z may be fixed or variable, and may have any value. For example, the value of x typically is from about 0.1 to about 1.9, and a value for z is from 0.0 to about 2.0. For one embodiment the values were x=0.5 and z=0. Hydroxyl groups may be a part of the metal-containing cation, and the compound may comprise hafnium oxy-hydroxy sulfate (HfO$_{2-x-z/2}$(OH)$_z$(SO$_4$)$_x$).

In other embodiments, the polyatomic anion may include one or more of sulfate (SO$_4^{2-}$), borate (BO$_3^{3-}$), phosphate (PO$_4^{3-}$), tungstate (WO$_4^{2-}$) and silicate (SiO$_4^{4-}$). The metal-containing cation may comprise a metal suboxide, and may include one or more of hafnium (Hf$^{4+}$), titanium (Ti$^{4+}$), zirconium (Zr$^{4+}$), cerium (Ce$^{4+}$), tin (Sn$^{4+}$), tantalum (Ta$^{5+}$), niobium (Nb$^{4+}$), yttrium (Y$^{3+}$), molybdenum (Mo$^{4+}$), tungsten (W$^{6+}$), aluminum (Al$^{3+}$), gallium (Ga$^{3+}$), zinc (Zn$^{2+}$), chromium (Cr$^{3+}$), iron (Fe$^{3+}$), bismuth (Bi$^{3+}$), lanthanides, hafnium oxy-hydroxide (HfO$_y$(OH)$_z^{(4-2y-z)+}$), zirconium oxy-hydroxide (ZrO$_y$(OH)$_z^{(4-2y-z)+}$), titanium oxy-hydroxide (TiO$_y$(OH)$_z^{(4-2y-z)+}$), tantalum oxy-hydroxide (TaO$_y$(OH)$_z^{(5-2y-z)+}$), yttrium oxy-hydroxide (YO$_y$(OH)$_z^{(3-2y-z)+}$), niobium oxy-hydroxide (NbO$_y$(OH)z$^{(4-2y-z)+}$), molybdenum oxy-hydroxide (MoO$_y$(OH)$_z^{(4-2y-z)+}$), tungsten oxy-hydroxide (WO$_y$(OH)$_z^{(6-2y-z)+}$), aluminum oxy-hydroxide (AlO$_y$(OH)$_z^{(3-2y-z)+}$), gallium oxy-hydroxide (GaO$_y$(OH)$_z^{(3-2y-z)+}$), zinc oxy-hydroxide (ZnO$_y$(OH)$_z^{(2-2y-z)+}$), chromium oxy-hydroxide (CrO$_y$(OH)$_z^{(3-2y-z)+}$), iron oxy-hydroxide (FeO$_y$(OH)$_z^{(3-2y-z)+}$), bismuth oxy-hydroxide (BiO$_y$(OH)$_z^{(3-2y-z)+}$), and oxy-hydroxides of the lanthanide series. The value of y is related to the charge on the metal cation and the amount of hydroxide and other polyatomic anion that is bound to the metal cation.

Embodiments of the method using polyatomic anions and metal-containing cations disclosed herein may result in the formation of a dielectric precursor material that does not require using organics for forming complexes, i.e., the sources of the anion and the cation do not contain organics. However, organic materials can be used, if desired or necessary for certain embodiments. For example, a non-complexing organic, such as ethanol, may be used as a partial solvent in the precursor solution. If complexing organics are not included in the precursor material, the precursor solution typically does not have to be heated or annealed at temperatures as high as 400° C. or higher, to decompose/combust any organic materials once the precursor solution is applied to a substrate. Polymerization of the precursor solution upon heating and/or drying results in the formation of amorphous films and not polycrystalline materials, thereby allowing solutions-based-application of the dielectric material on a substrate.

In general, disclosed embodiments of the present process may be conducted at ambient conditions, such as atmospheric pressure in air. Accordingly, vacuum processing is not required, but may be utilized if desired. The process may be conducted at a temperature above ambient, such as in a range of from about 80° C. to about 850° C., typically in a temperature range of from about 80° C. to at most 350° C., and often at a temperature of at most 100° C. These low pressure and low temperature processing steps may reduce the energy requirements for disclosed processes. Due to the low temperatures useful for processing the dielectric films, the films may be processed on or applied as a solution to low-temperature substrates, such as plastic substrates. The amorphous, non-crystalline dielectric precursor solution produced allows even, conformal coverage of the precursor solution on a substrate, such as on a wafer. The solution also may be applied in a predetermined, specific pattern, such as by using inkjet printing, so that no masking or etching steps are used. Accordingly, the process of the present disclosure may eliminate or reduce the usage of hazardous or toxic materials that may be used for the formation and removal of materials during photolithography processing on substrates. Thus the present process is time efficient and environmentally "green" relative to known processes. Moreover, the hafnium oxide and sulfate materials utilized in one example embodiment of the present disclosure may not be toxic materials.

Examples of materials used in the process of the present disclosure include compounds belonging to the family of compounds including hafnium oxy hydroxy sulfates (HfO$_{2-x-z/2}$(OH)$_z$(SO$_4$)$_x$), hafnium oxy hydroxy tungstates (HfO$_{2-x-z/2}$(OH)$_z$(WO$_4$)$_x$), hafnium oxy hydroxy borates (HfO$_{2-x-z/2}$(OH)$_z$(BO$_3$)$_x$), hafnium oxy hydroxy phosphates (HfO$_{2-x-z/2}$OH$_z$(PO$_4$)$_x$), and hafnium oxy hydroxy silicates ($HfO_{2-x-z/2}OH_z(SiO_4)_x$). These materials may be polymerized at temperatures as low as 80° C. and may remain amorphous up to approximately 740° C., and even as high as 1,200° C. Material polymerization may be controlled by adjusting the heating rate, by using co-solvents, by other suitable methods, and by any and all combinations of such methods. Amorphous films of the present disclosure may reduce defect formation at grain boundaries and may reduce crack formation upon an amorphous-to-crystalline transition. Moreover, the dielectric films of the present disclosure may have a reasonably high dielectric constant, i.e., a dielectric constant higher than the dielectric constant of organic compounds. The ability to form high quality dielectrics by solution-based processing, such as inkjet printing applications, allows formation of low cost electronic components, such as field effect transistors or capacitors.

Figure 2:
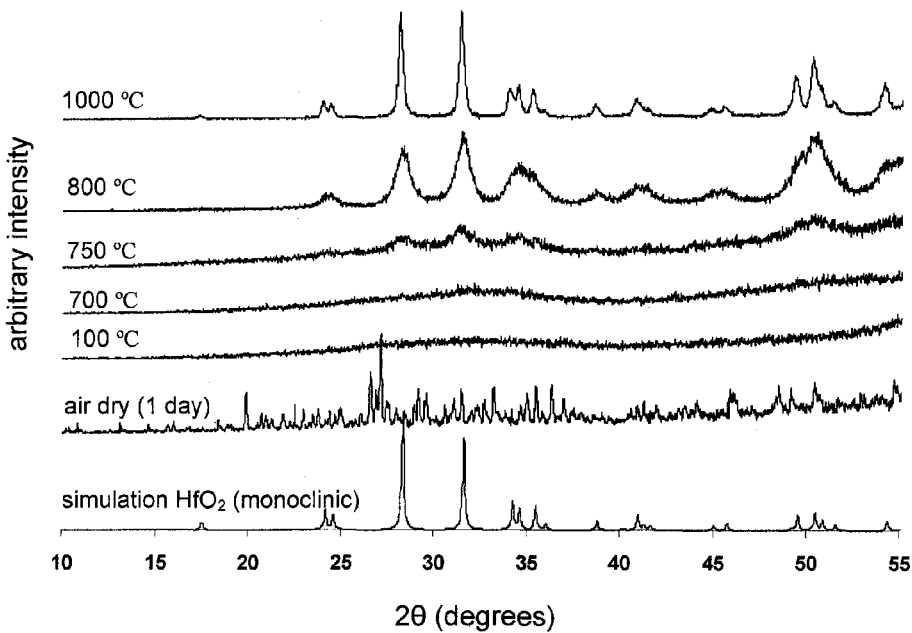
FIG. 2 is an XRD pattern for HafSOx powders after heating at stated temperatures in air for 1 hour, except as noted.

FIG. 2 schematically illustrates one embodiment of a process for applying precursor solution 16 to form a dielectric material. Precursor solution 16, such as hafnium oxy sulfate, may be applied to a substrate 18, such as a wafer, by an applicator 20. In one embodiment, applicator 20 may comprise an inkjet printer having nozzles 22. The aqueous precursor solution 16 is ejected through nozzles 22 of the inkjet printer. In other embodiments, applicator 20 may comprise a spin-coater, a dip-coater, or a spray-coater such that the method of applying the precursor solution may comprise, respectively, spin-coating, dip-coating, or spray-coating. Due to the amorphous, solution-based properties of precursor solution 16, precursor solution 16 may allow good conformal coverage when applied. Once applied to the substrate surface, or to a film or films deposited on the substrate, the precursor solution may be dehydrated, such as by heating with a heater 24, or by other dehydration devices, to remove or reduce the amount of water in the precursor solution. This dehydration step may cause precipitation of an amorphous dielectric material 26, such as a hafnium oxy sulfate thin film, on wafer 18.

Figure 3:
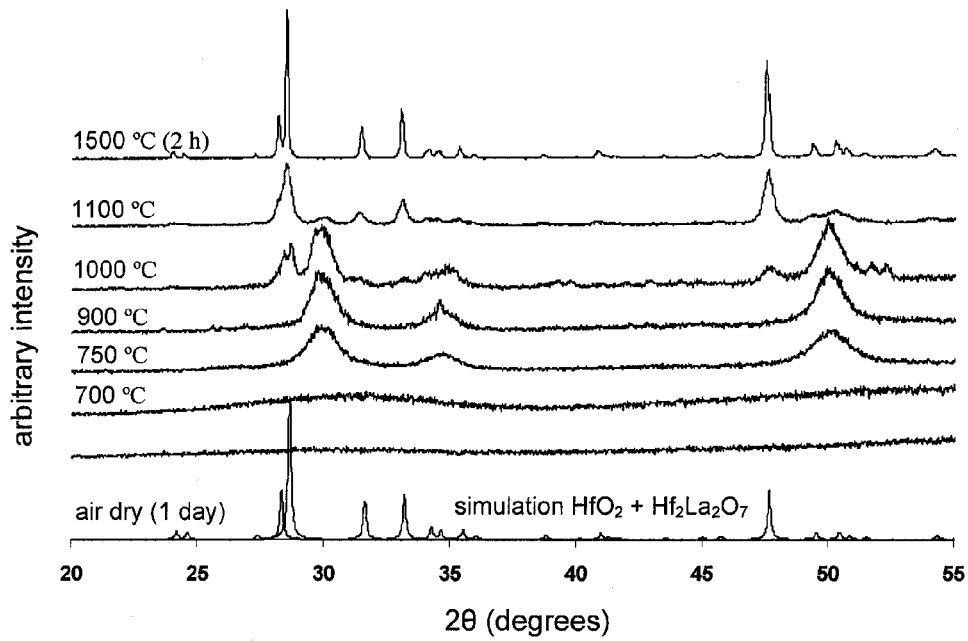
FIG. 3 is an XRD pattern for HafSOx:32% La powders after heating at stated temperatures for 1 hour, except as noted.

FIG. 3 is a graph showing possible solution concentrations for differing precursor concentrations for one embodiment of dielectric material precursor solutions 16 (see FIG. 1), in particular, for the reaction of sulfuric acid ($H_2SO_4$) with hafnium oxy chloride ($HfOCl_2$). More particularly, FIG. 3 shows a graph of total sulfate concentration (molarity (M)) versus total hafnium concentration (M). Region 28 represents a clear solution, i.e., a solution with no visually detectable precipitate therein, wherein region 28 is a region of excess sulfuric acid ($H_2SO_4$). Region 30 represents a clear solution, i.e., a solution with no visually detectable precipitate therein. Region 30 is a region of excess hafnium oxy chloride ($HfOCl_2$). Line 32 represents a stoichiometric line wherein sulfuric acid and hafnium oxy chloride are each present in a one-to-one ratio (1:1 stoichiometric ratio). Region 34 represents a precipitation area, i.e., a solution having a visually detectable precipitate therein. Region 34, or portions thereof, therefore, may represent solutions that are not best suited for forming smooth substantially defect free films by inkjet printing applications, but its use is not foreclosed. Accordingly, when precursor solution 16 (see FIG. 2) is applied through an inkjet printer application device 20 (see FIG. 2), it may be desirable that the concentration of the first and second reactants fall within either of regions 28 or 30, but not within solids region 34. Solids present in the solutions of region 34 may occlude nozzles 22, may form an unsmooth film, or may otherwise result in unfavorable precursor solution application. In other words, the solutions of regions 28 and 30 may represent possible precursor solution "inks" that may be applied through an inkjet printhead or by a dropper method.

II. General Discussion

New thin-film dielectrics and nanolaminates have been developed using solution deposition, typically aqueous solution deposition, of smooth, dense films. Solution deposition techniques include spin coating and inkjet printing. Solution deposition may be followed by modest thermal treatment (T<325° C.).

A variety of analytical techniques have been used to define the chemistry of the materials made according to the present disclosure, both as powders and films. The quality and functionality of the films have been assessed by X-ray reflectivity, electronic microscopy, and performance in electronic devices. Dielectric characteristics have been determined for working embodiments, and include permittivity values covering the range of from about 9 to about 12; breakdown fields up to at least 6 MV cm$^{-1}$; and leakage currents near 1 nA cm$^{-2}$ at field strengths of 1 MV cm$^{-1}$. The surface smoothness and pore-free nature of the films facilitate the production of unique nanolaminated structures having individual layers at least as thin as about 2 nanometers. Relatively high permittivity films can be realized using disclosed embodiments of the present invention, while also providing high-breakdown strengths and low-leakage currents in thin-film metal-insulator-metal (MIM) capacitors and thin-film transistors (TFTs). The exceptional characteristics of the insulating films also have allowed fabrication of unique nanolaminated structures.

Amorphous materials are desirable for use as thin-film dielectrics; they do not have grain boundaries, and hence are not susceptible to roughness and charge conduction associated with crystallites. Numerous oxides of hafnium and zirconium, e.g., the simple binaries, silicates, and aluminates, have been examined as candidates for high-permittivity dielectric applications. In multiple-component materials, crystallization can be inhibited to produce more robust breakdown characteristics relative to the pure binary oxides, though permittivity may be sacrificed. These dielectric films often are formed using a variety of metal-organic or metal-salt precursors and techniques such as atomic layer deposition (ALD), chemical vapor deposition (CVD), sol-gel processing, or combinations thereof. However, making useful dielectric films by solution deposition methods that are both dense and amorphous may require inhibiting crystallization and cracking, both during deposition and subsequent processing.

Certain disclosed embodiments of the present invention concern the development of metal oxide films. Metal oxides are exemplified herein generally by reference to hafnium and zirconium sulfate systems having representative formulas $HfO_{2-x}(SO_4)_x$ and $ZrO_{2-x}(SO_4)_x$, respectively, where $0.1 \leq x \leq 1.5$. These compounds are referred to herein by the acronyms HafSOx and ZircSOx, respectively. To define the chemistry and physical properties of these systems, HafSOx, and doped analogs thereof, such as the La-substituted derivative HafSOx:La, have been made, both as powders and thin films. Thin-film dielectric properties of HafSOx, ZircSOx, and selected derivatives have been assessed by fabricating capacitors and TFTs. These analyses revealed that very high-quality, dense films could be produced. Film thickness and fabrication of mixed HafSOx/ZircSOx nanolaminates can now be controlled by spin-coating processes.

A number of phases and crystal structures have been reported from examination of $HfO_2$—$SO_3$—$H_2O$ and $ZrO_2$—$SO_3$—$H_2O$ systems. Several structures are characterized as simple hydrates of formulations $Hf(SO_4)_2 \cdot nH_2O$ or $Zr(SO_4)_2 \cdot nH_2O$, exhibiting variations in the degree of hydration and in the structural dimensionality associated with the condensation of the metal atom, sulfate groups, and water. Materials rich in metal relative to sulfate are known, including $Zr_2(OH)_2(SO_4)_3 \cdot 4H_2O$; $Hf(OH)_2SO_4$, $Zr(OH)_2SO_4$, and their hydrates; $Hf_{18}O_{10}(OH)_{26}(SO_4)_{13} \cdot 33H_2O$ and $Zr_{18}O_4(OH)_{38.8}(SO_4)_{12.6} \cdot 33H_2O$; and $Zr_3O_5SO_4$ and its hydrate. All of these structures (with the possible exception of $Zr_3O_5SO_4$) are likely unstable when subjected to air at both room temperature and under moderate heating, resulting from changes in hydrogen bonding or dehydration. This allows the dehydration and condensation processes to be used to develop amorphous films.

Starting from aqueous solutions with selected fractions of sulfate relative to hafnium (variable x), HafSOx precipitates were induced by heating. FIG. 1 is a thermogravimetric analysis (TGA) of air-dried HafSOx precipitates. TGA is a thermal analysis technique used to measure changes in the weight (mass) of a sample as a function of temperature. Heating an air-dried HafSOx precipitate leads to mass loss in three domains. Similar characteristics have been observed for other HafSOx derivatives as well. The large mass loss below a temperature of about 200° C. is attributed to loss of incorporated water. Mass loss in the temperature range of from about 200° C. to about 700° C. is attributed mainly to elimination of more tightly bound hydroxyl species as water. The sharp mass loss that begins above about 700° C., is attributed to sulfate decomposition according to $SO_3(g) \rightarrow SO_2(g) + \frac{1}{2}O_2(g)$. Assuming dehydrated HafSOx powder is converted completely to $HfO_2$ between 700° C. and 950° C., the sulfate fraction can be calculated from the mass loss. Determining mass loss of samples revealed that increasing levels of sulfate in the mother solution yielded increasing levels of sulfate in precipitates. Specifically, the sulfate-to-hafnium ratio varied from about 46% to about 71% for dehydrated formulas of $HfO_{1.54}(SO_4)_{0.46}$ and $HfO_{1.29}(SO_4)_{0.71}$, respectively. The same maximum sulfate composition precipitated whether $H_2SO_4(aq)$ or $(NH_4)_2SO_4(aq)$ was used as the sulfate source; products with sulfate levels <46% were not examined. The onset of sulfate loss occurred above 720° C. for all samples, though some variations in the thermogravimetric profiles were observed. Peak positions for the derivatives of these heating curves, as definable values, reveal decomposition between 793° C. and 817° C. for samples tested. The highest decomposition temperatures were observed for samples having maximum sulfate content with $H_2SO_4(aq)$ as the sulfate source.

Again with reference to FIG. 1, samples with maximum sulfate content also were heated prior to TGA measurements. Mass losses associated with water were reduced, and calculated sulfate contents were similar for both preheated and regular samples. This sulfate content of 70-71% mimics the compositions of the reported crystals $Zr_{18}O_4(OH)_{38.8}(SO_4)_{12.6} \cdot 33H_2O$ and $Hf_{18}O_{10}(OH)_{26}(SO_4)_{13} \cdot 33H_2O$. From TGA studies, Ahmed, Fjellvåg, and Kjekshus (*Acta Chem. Scand.*, 53, 24 (1999) also found that sulfate decomposition for $Hf_{18}O_{23}(SO_4)_{13}$ and $Zr_{18}O_{23}(SO_4)_{13}$ occurs at temperatures higher than those for the Hf and Zr disulfates within their study, and higher than those for the basic sulfates $Hf(OH)_2SO_4 \cdot H_2O$ and $Zr_3O_5SO_4$ reported by others. In addition to enhanced thermal stability, a sulfate-to-metal ratio of approximately 13:18 exhibits special stability within this system. As such, this composition may be suitable for purposes where solution processing and heating are required.

The sulfate $La_2O_2SO_4$ has a decomposition temperature of greater than 1,300° C. Lanthanum (La) was added to the mother HafSOx solution to produce additional compounds having modified physical properties, such as modified dehydration properties and thermal characteristics, one example being thermal stability. A mixed-metal system, $Hf_{1-z}La_zO_{2-x-z/2}(SO_4)_x$ (HafSOx:La), exemplifies such compounds. To produce such compounds a solution containing the precursor materials and 23% La (total metal) was heated to form precipitates. Chemical analysis indicated that only 3% La was found in the product. From TGA, a sulfate-to-metal ratio of 71% was established, and the decomposition (as derivative peak) at 820° C. was found to be consistent with maximal sulfate content. Co-precipitation was then induced by adding $NH_3(aq)$ to a salt solution of the constituent species containing 32% La. The chemical composition of the product was analyzed, revealing the same fraction of La as that present in the mother solution. Thermal decomposition for this formula was markedly different from undoped HafSOx. Mass loss attributed to sulfate was apparent above 700° C., though heating features were less abrupt and no constant mass was achieved with heating to 1,000° C., even when heating at the slower rate of 2° C. minute$^{-1}$. For this heating rate, decomposition (as derivative peak) occurs at approximately 870° C., though this value depends on heating conditions. Complete decomposition to the oxides was accomplished by heating to 1,500° C., yielding the formula $Hf_{0.68}La_{0.32}O_{1.48}(SO_4)_{0.36}$ for the dried precipitate.

XRD data were collected for precipitated HafSOx powders to establish temperature ranges for crystalline phases. After air drying, a complex diffraction pattern was recorded for samples having maximum sulfate content and $H_2SO_4(aq)$ as the sulfate source; other samples exhibited no or diffuse diffraction. XRD data for HafSOx (x=0.70) are shown in FIG. 2. After heating air dried samples for 1 hour at temperatures between from about 100° C. to about 700° C., the material becomes amorphous. Crystalline peaks characteristic of monoclinic $HfO_2$ are observed after heating at 750° C. and above for 1 hour. As the onset of sulfate loss occurs at 720° C. by TGA, crystallization is found to coincide with sulfate loss. Inclusion of 3% La generates similar diffraction profiles for temperatures up to 1,000° C.

XRD data for HafSOx:32% La are shown in FIG. 3. Both the precipitated material and that heated to 700° C. are X-ray amorphous. Just as with unsubstituted HafSOx, a detectable crystalline phase forms between 700° C. and 750° C. (1 hour heating), which is the temperature interval over which sulfate begins to decompose. Yet with substitution of 32% La, monoclinic $HfO_2$ is not the detected phase. Rather, the diffraction profile is consistent with cubic (or tetragonal) $HfO_2$, the phases of $HfO_2$ often stabilized by lanthanide atom inclusion. High-temperature heating generates $Hf_2La_2O_7$ and monoclinic $HfO_2$ as predicted from consideration of the appropriate phase diagrams. Intermediate temperature oxide phases are consistent with work on the system $ZrO_2$—$La_2O_3$ by Zhang, Kershaw, Dwight and Wold (*J. Solid State Chem.*, 72, 131 (1988)), who found that 10-37% lanthanum stabilizes cubic zirconia at 900° C., with phase separation occurring at 1,050° C.

HafSOx and HafSOx:La thin films having thicknesses of from about 200 nanometers to about 300 nanometers were fabricated for materials characterization. Compositions for the films were determined with electron-probe microanalysis (EPMA), based on relative concentrations of Hf, La, Cl, and S. Oxygen levels are less precise by this method, so dehydrated formulas are expressed. Two representative HafSOx films heated at 325° C. (5 minutes) were determined to be $HfO_{0.98}(SO_4)_{0.67}Cl_{0.69}$ and $HfO_{0.915}(SO_4)_{0.85}Cl_{0.47}$, representing 67% and 85% sulfate relative to hafnium. The 85% sulfate film was further heated to 650° C. (5 minutes) and determined to be $HfO_{1.275}(SO_4)_{0.71}Cl_{0.03}$. Also, the HafSOx:La film heated at 330° C. (5 minutes) was determined to be $Hf_{0.76}La_{0.24}O_{0.73}(SO_4)_{0.96}Cl_{0.38}$. For HafSOx heated to 650° C., the sulfate ratio was reduced to 71%, which matches the composition for heat precipitated HafSOx powders with maximal sulfate. For HafSOx:La, the measured fraction of La (24%) agrees well with the 23% La concentration in the precursor solution.

Transmission Fourier transform infrared (FTIR) analyses for HafSOx (x~0.67 & 0.85), and HafSOx:La films were collected after heating for 5 minutes at selected temperatures. FTIR spectra were used to detect principally two functional groups. Absorption in the range 3000-3600 $cm^{-1}$ is attributed to hydroxyl groups; and absorption in the range 1000-1200 $cm^{-1}$ is attributed to sulfate groups. With heating, hydroxyl absorption diminishes over the range from about 325° C. to about 600° C., while sulfate stretches are nearly eliminated between about 650° C. and 700° C. for HafSOx films, and between about 700° C. and 750° C. for the HafSOx:La film. (The profiles for sulfate absorption are slightly distorted since $SiO_2$ from the substrates absorbs at a similar energy, but spectra are qualitatively correct.)

Figure 4:
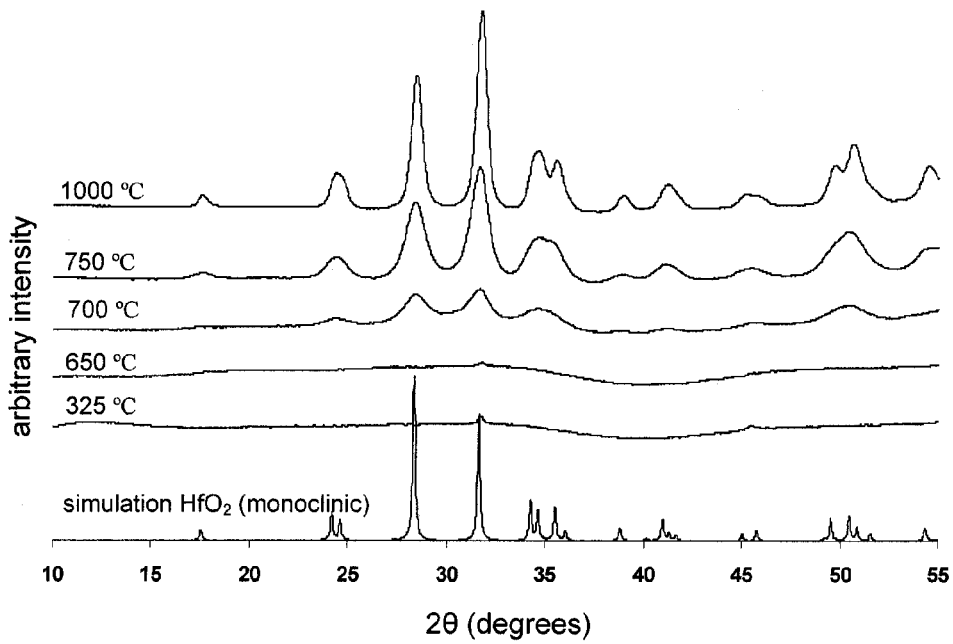
FIG. 4 is an XRD pattern for HafSOx films after heating at given temperatures in air for 5 minutes, where the very small features at 31.8° and 45.6° are attributed to the substrate.
Figure 5:
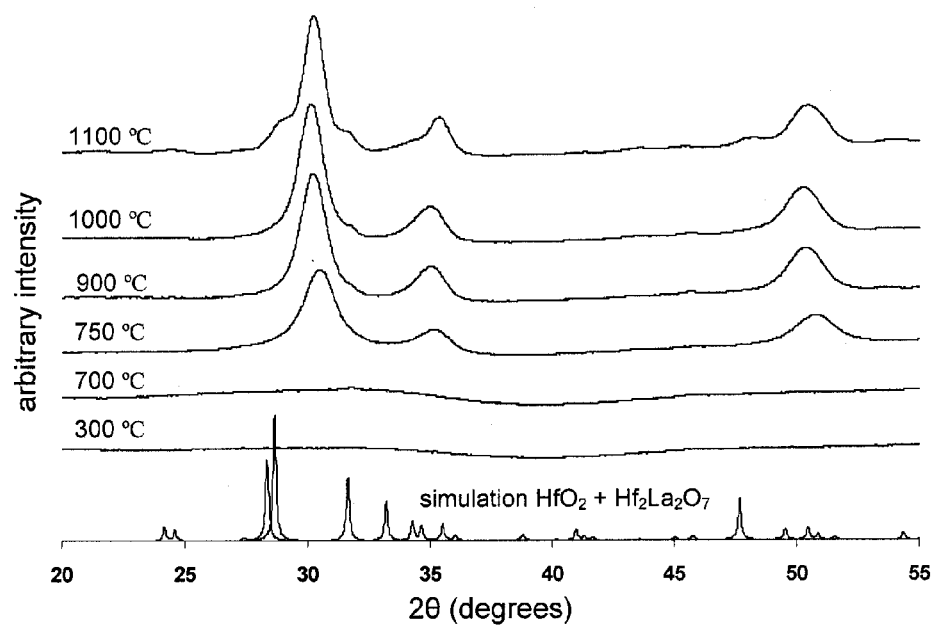
FIG. 5 is an XRD pattern for HafSOx:24% La thin films after heating at stated temperatures in air for 5 minutes.

Thin-film XRD data were collected for HafSOx (x~0.67 & 0.85) and HafSOx:24% La films after heating at indicated temperatures for 5 minutes each, as shown in FIGS. 4 and 5, respectively. For both HafSOx compositions, films are X-ray amorphous from about 325° C. to about 650° C. Monoclinic $HfO_2$ is detected at about 700° C. and above. HafSOx:La films are amorphous from about 330° C. to about 700° C., while a cubic phase is detected from about 750° C. to about 1000° C. The cubic phase is apparently unstable at 1,100° C., as separation into monoclinic $HfO_2$ and $Hf_2La_2O_7$ phases commences. For HafSOx and HafSOx:La films, loss of sulfate can be directly correlated with oxide crystallization, which is consistent with powder behavior.

Figure 6:
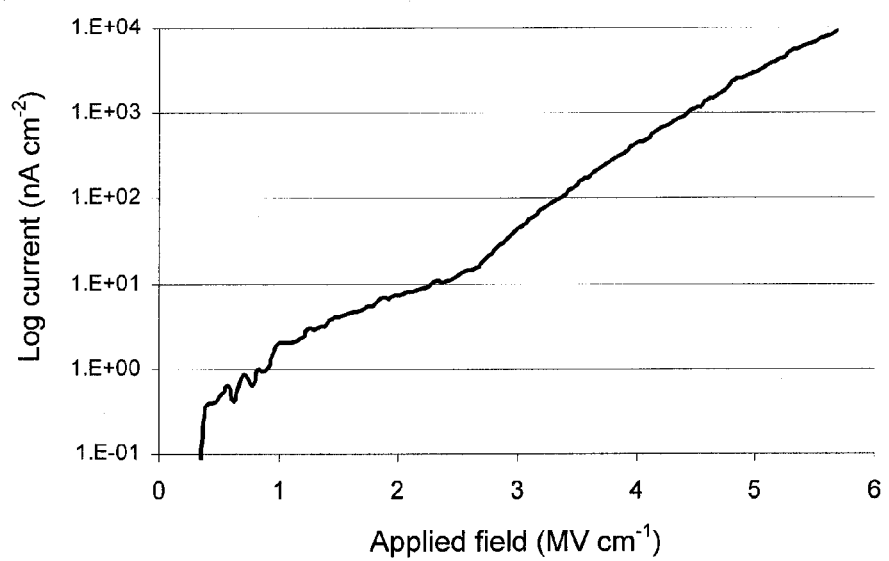
FIG. 6 illustrates dielectric breakdown characteristics for HafSOx film.

Films of HafSOx, ZircSOx, and derivatives thereof, were deposited by spin-coating for use as dielectrics. MIM capacitors were tested to determine the parameters of permittivity and loss tangent at 1 kHz, as well as electric-field breakdown strength. "Breakdown" is defined as the field where current density surpasses 10 $\mu A\ cm^{-2}$. Similar tests were conducted for HafSOx, HafSOx/La, ZircSOx, ZircSOx:La, HafSOx:Ce, and ZircSOx:Ca. FIG. 6 illustrates dielectric breakdown characteristics for HafSOx dielectric film where the aluminum dot contacts represent an area of 0.011 $cm^2$. HafSOx and ZircSOx films had breakdown fields of 4-6 $MV\ cm^{-1}$. A breakdown field of 3.6 $MV\ cm^{-1}$ was found for ZircSOx:Ca. At an applied field of 1 $MV\ cm^{-1}$, all six variations exhibited leakage current less than 50 $nA\ cm^{-2}$, and leakage currents less than 10 $nA\ cm^{-2}$ were observed for many compositions. Permittivity values of from about 9 to about 12, and loss tangent <1% were measured for all variations.

Field-effect transistors (FETs) were fabricated with HafSOx:La or ZircSOx:La as the gate dielectrics and zinc indium oxide or zinc tin oxide as the channels. Current modulation was achieved; drain-to-source current saturated with increasing drain-to-source voltage, providing an on-to-off ratio greater than $10^6$; and gate leakage currents are in the range of $pA\ cm^{-2}$. These results clearly indicate that HafSOx:La and ZircSOx:La films are sufficiently robust for device integration; the requirement for a quality dielectric/channel interface is also met.

As a new class of amorphous multi-component oxide dielectric films, HafSOx, ZircSOx, and their derivatives may be compared to other mixed systems, particularly aluminates and silicates, represented as $(MO_2)_{1-x}(Al_2O_3)_x$ and $(MO_2)_{1-x}(SiO_2)_x$ where M=Hf or Zr. Various film compositions for each of these systems have been deposited by conventional vapor phase techniques. In the cases of Hf or Zr aluminates and silicates with 20-50 mol % $Al_2O_3$ or $SiO_2$ (as common compositions for dielectric applications), crystallization typically occurs at about 800° C. to about 1,000° C., in conjunction with phase segregation. For tested HafSOx powders and films, crystallization occurs at approximately 700° C. as sulfate decomposes. As dielectrics, these aluminates and silicates exhibit permittivity values of 10-15, compared to values of 9-12 for HafSOx and ZircSOx. This new class of oxide sulfate materials can be considered amorphous, moderate temperature, medium permittivity dielectrics.

Figure 7:
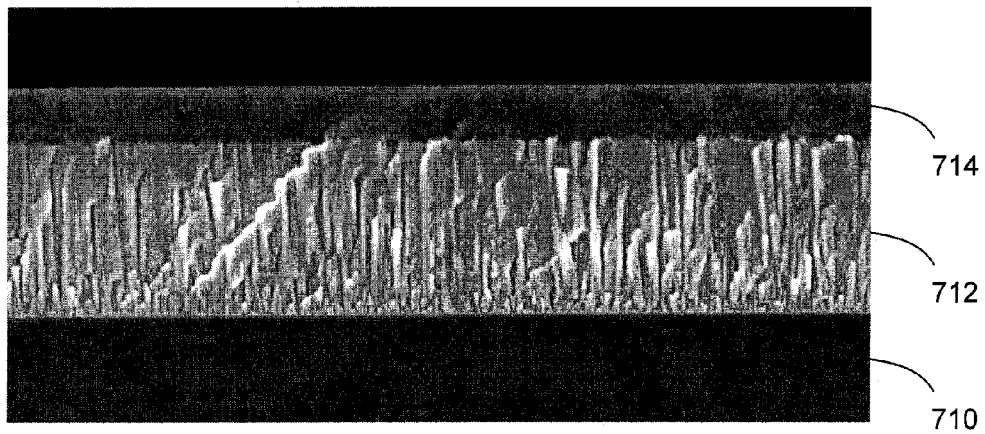
FIG. 7 is an SEM showing one embodiment of HafSOx deposited on tantalum (Ta) metal on a silicon dioxide substrate.
Figure 8:
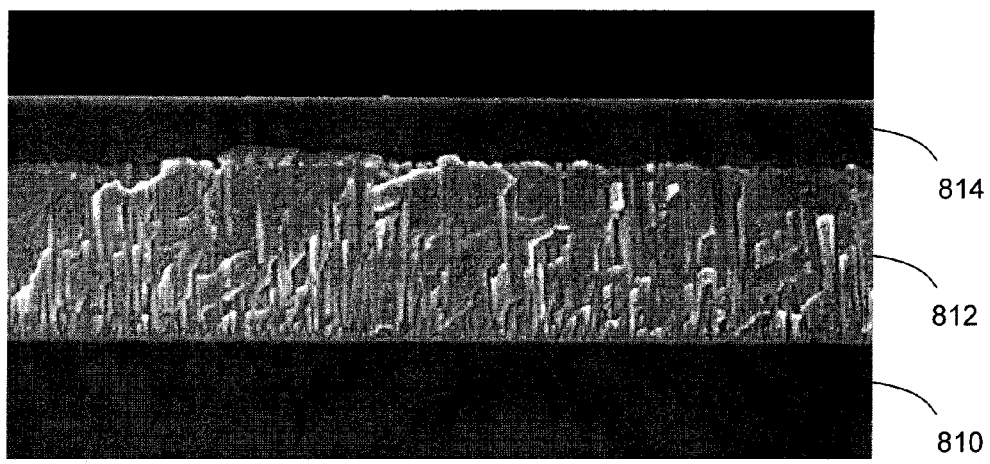
FIG. 8 is an SEM for HafSOx:24% La deposited on Ta.

Scanning electron microscopy (SEM) and X-ray reflectivity (XRR) were used to further examine film qualities. SEM images for HafSOx and HafSOx:La films are shown in FIGS. 7 and 8. These images reveal smooth surfaces and dense, uniform cross-sections for films having thicknesses in the range of from about 150 nanometers to about 300 nanometers, as typically used for dielectric testing. FIG. 7 shows a $SiO_2$ substrate 710 upon which a 506-nm layer of Ta metal 712 and a 160-nm HafSOx film 714 have been deposited. FIG. 8 shows a $SiO_2$ substrate 810 upon which a 512-nm layer of Ta metal 812 and a 192-nm HafSOx/La film 814 have been deposited.

Figure 9:
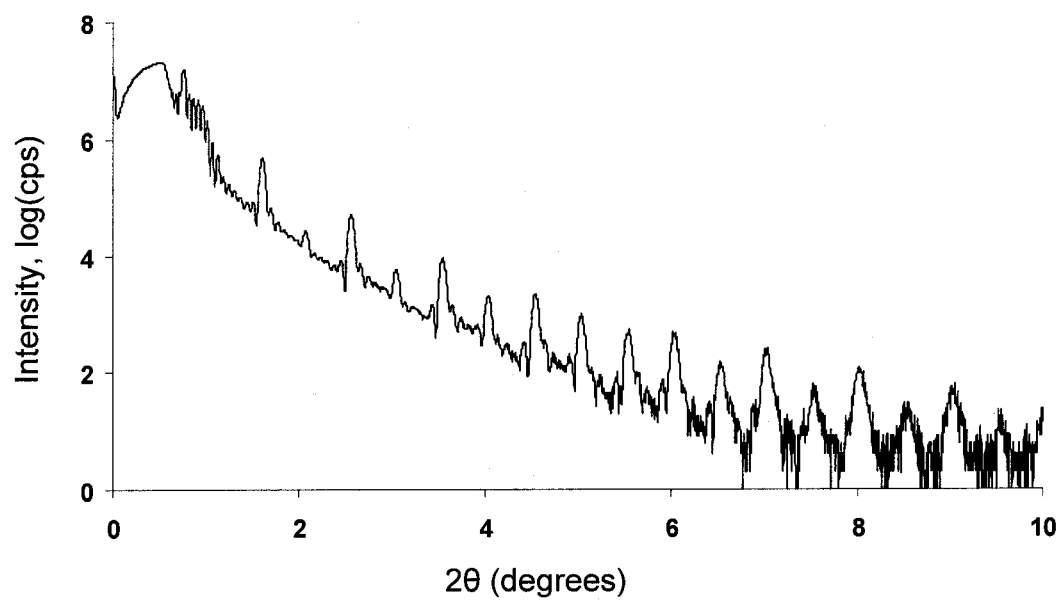
FIG. 9 is an XRR pattern for HafSOx/ZircSOx multilayer thin-film comprising 14 alternating layers (7 bilayers) having a bilayer thickness of 17.6 nm.

As a stringent measure of reproducibility for thinner film fabrication, multilayer structures with a HafSOx/ZircSOx repeating motif were deposited and analyzed by XRR. The interference pattern from one XRR scan is shown in FIG. 9. Positions of peak maxima, representative of standing wave harmonics, were used to find the thickness of the repeating bilayer. By systematically varying the thicknesses of HafSOx and ZircSOx independently, the thicknesses of the individual layers were determined. Within a nanolaminate stack, single layers as thin as about 3 nanometers were measured. As high order reflections in the diffraction pattern are observed, each bilayer was deposited with a variability <0.5, including roughness.

Shrinking device dimensions have led to the need to replace thin, high leakage-current $SiO_2$ as a dielectric in Si CMOS technologies. The replacement dielectrics must exhibit a high permittivity, allowing thicker layers to exhibit the same device capacitance with smaller leakage currents. $HfO_2$ and $ZrO_2$ have attracted considerable attention as replacement gate dielectrics because of their desirable dielectric properties and thermal properties. One of the challenges for $HfO_2$ and $ZrO_2$ dielectrics is making smooth, dense, pinhole-free, ultra-thin films having a thickness less than or equal to 13 nm. Previously ultra-thin films have been formed using atomic layer deposition (ALD). Despite some promising results from ALD, the processing requires using a vacuum with long deposition times (1 Å/min), which leads to high costs and low throughput. This has driven some work on the solution based deposition of $HfO_2$ and $ZrO_2$. To date these films have not reached the same uniformity and density of the ALD films.

Using an exchange reaction, ultra-thin $M(OH)_x$ and $MO_x$ films can be fabricated that rival ALD quality and are suitable for use in DRAM (dynamic random access memory) and Si CMOS (complementary metal-oxide semiconductor) technologies. For disclosed embodiments, the films are deposited in a sulfate form via inorganic condensation using spin-coating. For example, a semi-solid film can be formed with the composition $MO_x \cdot HCl \cdot H_2SO_4$. The sulfate is removed by ion exchange using an aqueous sodium hydroxide solution:

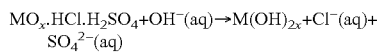

The resulting hydroxo and/or oxide films are smooth, dense, and pinhole free. For example, $HfO_2$ films with a thickness of about 2 nanometers can fabricated from HafSOx films. Exchanged films are subjected to thermal treatments up to about 800° C. for about 10 seconds to 10 minutes, resulting in a film surface roughness of about 0.1 nanometer. Such film characteristics satisfy requirements for metal-dielectric gates in CMOS and related technologies, while replacing expensive atomic layer deposition processing with low-cost spin-on or misting techniques.

The deposited semi-solid hydrated hydroxo films allow for anion exchange without disruption of the films' morphology. For example, oxoanions such as $SO_4^{2-}$, $WO_4^{2-}$, $PO_4^{3-}$, $AsO_4^{3-}$, $SiO_4^{4-}$, $VO_4^{3-}$, $AlO_4^{5-}$, $GaO_4^{5-}$, and their protonated forms, e.g., $HPO_4^{2-}$, $H_2PO_4^{-}$, and the halides $F^-$, $Cl^-$, $Br^-$, and $I^-$, can be selectively exchanged by placing the films in a metal salt bath, e.g., $Na_2SO_4(aq)$. This provides opportunities to optimize film performance for electronic applications and other applications, such as ion exchange chromatography and filtration.

For some embodiments of oxide films, it is difficult to produce single-source precursor liquid suspensions that can be directly applied to a substrate to provide a complex composition, e.g., two or more metal atoms. The following methods allow the production of such liquid suspensions and their use as single-source precursors for deposition of films of suitable quality for device applications.

The following describes a general method for synthesizing an aqueous precursor solution and depositing metal oxide films using the precursor. The aqueous precursor is distinctive in that it comprises polymeric or oligomeric metal-hydroxo compounds condensed via hydrolysis in a non-aqueous polar solvent and subsequently transferred to an aqueous environment for deposition. Advantageous thin-film electrical and optical properties and processing temperatures are achieved by condensing metal hydroxides to dense solid oxides without deleterious organic contaminants. Disclosed embodiments of the synthetic method follow the general procedure: 1) dissolution of metal salt in polar solvent; 2) hydrolysis and condensation; 3) solvent evaporation; 4) dissolution in $H_2O$; and 5) solution deposition and curing.

One or more soluble salts comprising a metal cation ($M^{a+}$) and one or more anions ($X^{b-}$) are dissolved in a non-complexing, non-aqueous polar solvent such as aliphatic alcohols or nitriles, particularly lower (10 carbon atoms or fewer) alkyl alcohols and nitriles, such as methanol, ethanol, acetonitrile, or a mixture thereof. Many solvent systems are possible. Suitable solvents for a particular application can be selected by considering boiling point (typically less than 150° C.), low toxicity, and acid-base and redox properties compatible with intended solution-phase reactions. Metal sources may include simple ionic or molecular salts ($Zn(NO_3)_2$, $SnCl_4$, etc.); oxy or hydroxy salts ($ZrO(NO_3)_2$, $ZnOHCl$, etc.); or potentially organic salts ($Fe(CH_3CO_2)_2$, $Cu(CHOO)_2$, etc.). At least one of the metal cations must have a formal charge greater than or equal to $3^+$ and the total concentration of such ions ($M^{a+}$ where $a \geq 3$) should exceed 50 mol % of the metal cations in the target oxide. Concurrently, an amount of $H_2O$ is introduced into the solution as hydrates of the metal salts described above, as a pure liquid, or a basic solution detailed below. The amount of water is determined by the cations chosen; typical amounts of water will not exceed 20 mol % of the non-aqueous polar solvent.

The pH of the solution is then raised relative to the starting pH by adding an appropriate base or by reaction of free protons via oxidation-reduction mechanisms. The increased pH drives hydrolysis of the $H_2O$ ligands bound by the acidic ($a \geq 3$) cations and condensation of the resulting hydroxocations. The final solution pH depends upon the metal cations used, but will typically be in the range of about 2-9. This may be accomplished using one of the following techniques, or any and all combinations thereof:

a) Addition of a basic aqueous solution containing $NH_4OH$, $(NH_4)_3PO_4$, CsOH, or similar compounds. Specific compounds ($NH_4OH$) may be chosen to decompose or volatilize during subsequent processing. Other cations (e.g., Cs) or polyatomic anions (e.g., $PO_4^{-3}$) may be used if they are intended to comprise part of the final oxide film to achieve unique morphological, optical, or electrical properties following dehydration.

b) Addition and dissolution of a small amount of a basic oxide such as CaO or SrO, with a similar goal of inclusion in the final oxide film.

c) Addition of $NH_3$ or other gaseous compounds, which form a basic solution in $H_2O$.

d) Addition of electropositive metal reducing agents, such as Zn, Al or Fe, which may consume protons through direct reduction to $H_2$, or as part of other proton-consuming oxidation-reduction processes such as the reduction of $NO_3^-$. Resultant cationic species are thereafter incorporated into the final oxide film.

e) Addition of aqueous or gaseous oxidizing or reducing agents such as $N_2H_4$, $H_2CO$, or $H_2O_2$ in liquid form, or as soluble salts, with a similar purpose of consuming protons or decomposing counter ions but without inclusion in the final oxide film.

The solution may be stirred at room temperature, heated, or exposed to solvothermal conditions to promote thermohydrolysis and condensation, depending on the final composition desired. Following a suitable reaction period the solution will contain one or more soluble oligomeric or polymeric metal-hydroxo cationic species. These species may be homo or hetero-metallic in nature. The degree of condensation is limited by the restricted molar ratio of $H_2O$ (aquo- and hydroxo-ligands) available, while the decreased polarity and size of the non-aqueous solvent relative to $H_2O$ may prevent additional condensation and precipitation processes through steric effects or altered charge-screening properties.

Soluble metal species are isolated by evaporating the non-aqueous solvent. Isolated metal-hydroxo compounds may form crystalline or amorphous solids or gels depending on certain processing considerations, such as solvent, counterion, and hydrolysis ratio.

Precursor solutions for oxide films are prepared by dissolving or dispersing the isolated solid in $H_2O$. The resulting sol or solution is homogenous, and may or may not be thermodynamically stable.

Precursor solutions are applied to a substrate using any suitable technique, including printing, spin, spray, or dip-coating to form a patterned or blanket liquid film. Liquid films are thermally cured under atmospheric conditions for about 5-240 minutes at a temperature from about 100° C. to 600° C. Vacuum or forming gas (e.g., $H_2$ and flowing $N_2$ or Ar) anneals may be used to alter oxygen stoichiometry or cation oxidation state as appropriate for the chemical or optoelectronic properties desired.

The smoothness and high atomic density of the films described herein allow fabrication of purely inorganic nanolaminates via solution processing. These films represent a new platform for developing a wide range of applications, as discussed further below.

III. Applications

A person of ordinary skill in the art will appreciate that the HafSOx and ZircSOx compounds, and films comprising such compounds, can be used to make a number of different devices, and can be used to practice a variety of processes utilizing such compounds. Metal-organic precursors have been extensively employed in the solution-based deposition of inorganic oxides. The presence of the organic moiety necessitates a high-temperature burnout step, which leads to significant volume change and generally to crystallization and the phenomenon of "mud cracking." These problems are eliminated by using disclosed embodiments of the present invention and suitable inorganic compositions to form amorphous HafSOx and ZircSOx films, where simple dehydration and polymerization lead to film quality preservation. To understand phase stability, representative HafSOx and HafSOx:La powders and films were characterized at various temperatures. Thin-films based on HafSOx and ZircSOx were deposited in multiple configurations in order to examine the quality and utility of the films. Several derivatives have been used to produce capacitor dielectrics. HafSOx:La and ZircSOx:La were used to form gate dielectrics in FET devices. Nanolaminate layers of HafSOx and ZircSOx exhibited remarkable smoothness with reproducibility within a couple atomic layers. Classes of films comprising HafSOx, ZircSOx, and their derivatives are useful, amongst other things, as electrical insulators, protective barriers, optical coatings, and/or as inorganic polymers for photolithography.

A. Patterned Films for Resist, Imprint Lithography, and Printing

Photolithography is commonly used to transfer geometric shapes on a mask to the surface of a silicon wafer or other semiconductor. For the past four decades, photolithographic processing has been the driving force for the improvements in resolution and dimensional control of device features in the microelectronics industry. These advances have made possible the high-performance personal computers, cell phones, CD players, and other innumerable advanced electronic products that are now considered to be essential parts of our lives. The photolithographic advances that have made these products possible have largely centered on developing short-wavelength exposure tools and an extraordinary extension in the resolution and feature-size capabilities of polymer resists. As the quest for ever smaller features and device-yield improvements continue, however, the limitations and inefficiencies of polymer-based resist technology are becoming more evident.

The smallest feature sizes realized via lithography have been produced by electron-beam writing of inorganic materials. The beam-dose energies required to produce these features, however, have been much too high to receive more than passing interest for use in a manufacturing environment.

During the deposition and processing of the films described herein, it is possible to control the film hydration level, which provides a method for controlling the interdiffusion of stacked films and their resulting physical and chemical properties. This controlled interdiffusion with resulting induced modifications in material solubility, coupled with the high quality of the films, was used to develop a new lithographic patterning method involving amorphous and crystalline films. This methodology involves depositing and reacting two distinct films, and it is designated as bilayer diffusion. In addition, small coordinating species such as peroxide ($O_2^{2-}$) can be incorporated into aqueous-based inorganic liquid suspensions and films to provide an additional, new lithographic patterning method. In this technique, energy (e.g., light, electron beam, heat) can be applied to films, inducing condensation reactions that alter the solubility of the film, thereby allowing lithographic patterning.

Figure 10:
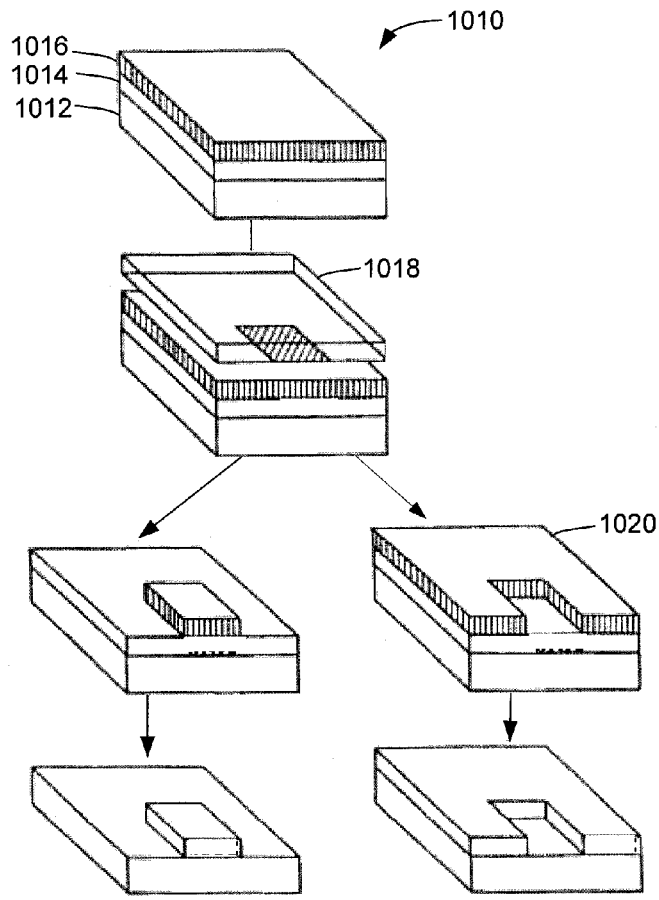
FIG. 10 is a schematic diagram illustrating positive or negative photoresist procedures.

Patterns can be formed using a positive or negative photoresist. This process is illustrated schematically in FIG. 10 with reference to a laminate structure 1010 having a silicon substrate 1012, a silica layer 1014 and a resist layer 1016. For positive resists, the resist layer 1016 is exposed to an energy source, such as UV light, wherever the underlying material is to be removed. In these resists, exposure to the UV light changes the chemical structure of the resist layer 1016 so that it becomes more soluble in the developer. The exposed resist layer 1016 is then removed by the developer solution, leaving areas of the bare underlying material. In other words, "whatever shows, goes." The mask 1018, therefore, contains an exact copy of the pattern which is to remain on the wafer.

Negative resists behave in just the opposite manner. Exposure to the UV light causes the negative resist to polymerize, and it therefore is more difficult to dissolve. As a result, the negative resist 1020 remains on the surface wherever it is exposed, and the developer solution removes only the unexposed portions. Masks used for negative photoresists, therefore, contain the inverse (or photographic "negative") of the pattern to be transferred.

Resist materials in current use for electronics manufacture are organic polymers. These polymers exhibit coiling, morphologies, and diffusion chemistries that limit pattern resolution. Inorganic thin films of the present invention form the basis for a new resist technology. Here, negative resists can be realized by exposing the inorganic films in semi-solid form to light or electron beams, causing them to lose solvent, particularly water during dehydration, or small coordinating ligands such as $O_2^{2-}$. This hardens the films, rendering them insoluble in acid.

One embodiment of a positive resist can be made using a bilayer system. A first layer of the bilayer comprises a copper formate film deposited on a hafnium oxide sulfate (HafSOx) film. The copper formate film is soluble in acid and the undoped HafSOx film is insoluble in acid. Exposing the bilayer to light through a mask or to a focused electron beam causes the two films to interdiffuse in exposed areas, thereby rendering the previously undoped HafSOx film soluble.

Figure 11:
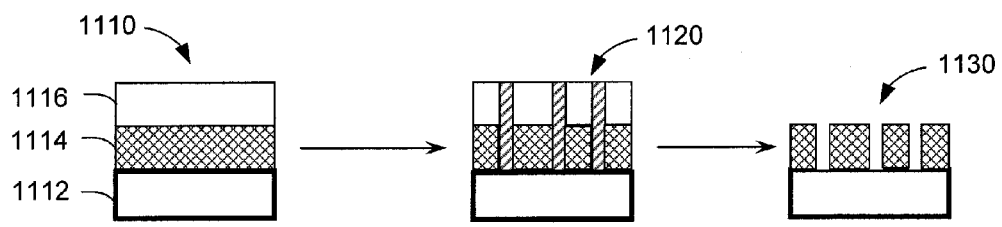
FIG. 11 is a schematic diagram illustrating a positive resist using a bilayer system, the illustrated embodiment comprising a Cu-doped zirconium oxide sulfate (Cu:ZircSOx) film deposited on a hafnium oxide sulfate (HafSOx) film.

One embodiment of this process is illustrated schematically in FIG. 11. With reference to FIG. 11, a laminate structure 1110 is first formed, such as by spin coating or inkjet coating suitable materials, in desired orders and thicknesses as required to define a working device. More specifically, a substrate material 1112 is first selected. A person of ordinary skill in the art will appreciate that any of a number of substrate materials potentially can be used to practice this embodiment of the present invention. Solely by way of example, and without limitation, suitable substrates include semiconductor materials, metals, glass, polymeric materials, and combinations thereof. As such the resist technology can be useful for a variety of applications in semiconductor manufacture. Once a suitable substrate 1112 is selected, a first layer 1114 of HafSOx is solution deposited onto the substrate 1112. Thereafter, a second layer, such as a layer 1116 of Cu:ZircSOx, is solution deposited onto layer 1114. The laminate structure 1110 is then subjected to an energy source, such as an electron beam or light, through a mask. Upon exposure to light or an electron beam through a mask, the two films interdiffuse in the exposed areas to render the previously undoped HafSOx film soluble to produce a laminate structure 1120. The exposed structure 1120 is then developed. The previously undoped HafSOx film is soluble, and hence is removed as indicated in laminate structure 1130.

On a flexible or glass substrate, the pattern illustrated in structure 1130 can be considered the master plate for imprint lithography or for generalized printing processes such as gravure printing. Forming a hardened patterned material of HafSOx in this way also provides a means for developing micro- and nano-channel arrays in the fabrication of devices for fluid control and delivery. Such devices could be applied in medical diagnostics, ink delivery, and chemical synthesis.

Figure 12:
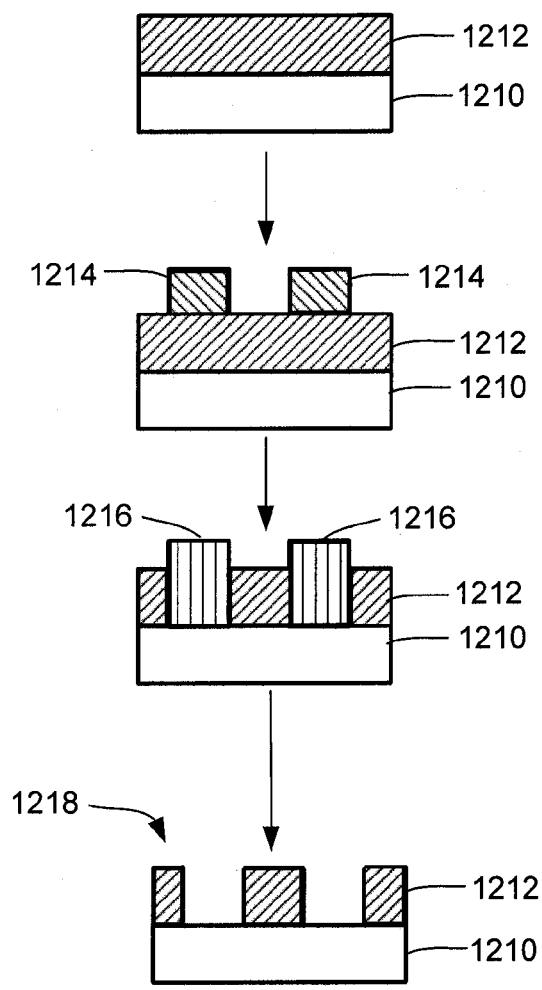
FIG. 12 is a schematic diagram illustrating a bilayer process for producing a patterned oxide on a substrate.

Another embodiment of a bilayer process is shown in FIG. 12. The process produces a patterned oxide on a selected substrate 1210. The substrate can, for example, be a glass, semiconductor wafer, metal, metal alloy, plastic, or a combination thereof. The first step of the process involves depositing a thin film 1212 (from about 1 nm to about 100 nm) of a solid acid or base, e.g., hydrated sulfate, phosphate, nitrate, silicate, aluminate, borate, or mixtures thereof, containing one or more of the metals Sc, Ti, V, Cr, Mn, Fe, Co, Ni, Zn, Y, Zr, Nb, Mo, In, Sn, Sb, Hf, Ta, W, Ir, Pt, La, Ce, Pr, Nd, Pm, Sm, Eu, Gd, Tb, Dy, Ho, Er, Tm, Yb, or Lu. In addition the solid acid/base can contain one or more of $NH_3$, OH, F, Cl, Br, I. The solid acid/base is preferably deposited via spin coating or printing; physical and vapor deposition are additional options. As one example, the solid acid can be deposited from an aqueous solution of $HfOCl_2$ and $H_2SO_4$(aq) via spin coating. The solid acid is heated sufficiently to produce a structurally rigid film 1212, such as by heating at about 50° C. for about 2 minutes. In the printing mode of operation, the substrate 1210 can be placed on a heated platen (about 25-300° C.), and an ink containing an oxide precursor 1214, e.g., copper formate, can be applied in a desired pattern by delivery through an ink jet head or by bringing the substrate 1210 into contact with a template containing the precursor 1214. The template comprises a portion of a microcontact, letterpress, or gravure printer. Under heated conditions (greater than about 250° C.), the precursor 1214 decomposes to an oxide, subsequently reacting and interdiffusing with the solid acid, forming a product 1216 that can readily be washed or etched to reveal a pattern 1218. The oxide precursor also may be replaced by an ink suspension or paste containing fine oxide micro- or nanoparticles. Application of the fine particles with or without heating results in a direct reaction to form a product that can be etched to reveal a pattern.

Figure 13:
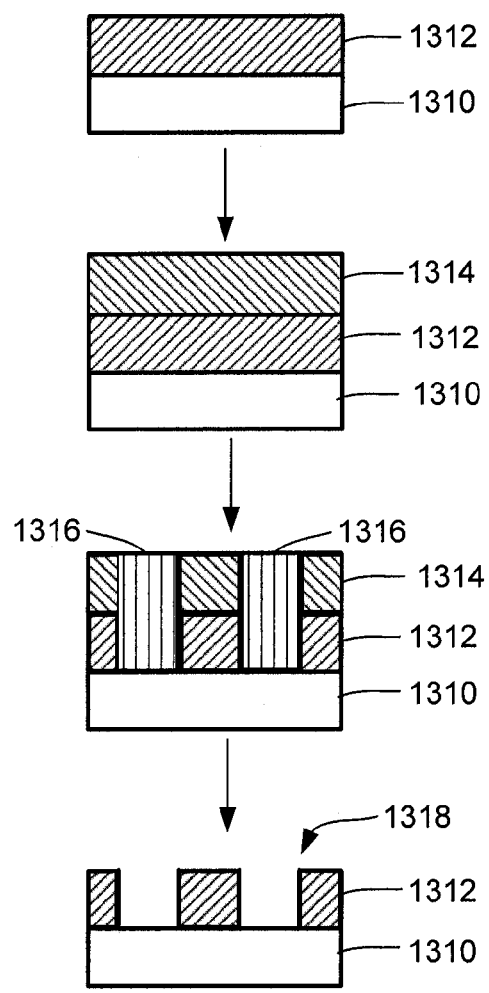
FIG. 13 is a schematic diagram illustrating a bilayer process for producing a patterned oxide on a substrate.

An alternate embodiment is shown in FIG. 13 for producing a patterned oxide on a selected substrate 1310. The initial step involves depositing a solid acid 1312 or base onto the substrate. The oxide precursor 1314 is then applied as a blanket coat via spin coating, printing, chemical vapor, or physical vapor deposition. A pattern of activated precursor 1316 is then formed by exposure to an energy source, such as light, via a photomask. Suitable light sources include an unfiltered deuterium lamp or a light source producing light at 193 nm, among others. Alternatively, a pattern of activated precursor 1316 is formed by directly writing with a focused laser or electron beam. If necessary, the activated and patterned structure 1316 can then be heated to a temperature from about 125° C. to about 350° C. to promote interdiffusion of the two layers. The exposed areas can then be etched to produce the desired pattern 1318. A procedure to improve exposure sensitivity involves using a very thin layer (about 2 nm) of oxide precursor on the solid acid. The precursor layer is then covered with a layer of an oxide that is deposited via any suitable technique, such as chemical or physical vapor deposition or by solution casting of oxide nanoparticles. The layers interdiffuse following exposure of the thin layer of precursor.

The processes described above correlate to a positive resist technology. It is also possible to select solid acids/bases and precursors that will produce insoluble products. These products can be used to produce positive images in at least two ways. In one embodiment, the two layers completely interdiffuse to form a single insoluble layer. Following printing or exposure and development, the soluble portions of the film are then washed or etched to reveal a positive pattern. In an alternative approach, interdiffusion occurs only at the interface between the precursor and the solid acid/base to produce a thin, insoluble barrier layer. This barrier layer is then used to control the etching of the film stack to produce a positive image. The barrier layer is photosensitive. Prior to light exposure, it prevents reaction between the precursor and solid acid/base layers that would otherwise readily interdiffuse on contact. Once the barrier layer is photosensitized, it becomes a reactive oxide. The barrier is "broken," and the top layer can then interdiffuse with the lower layer.

Next-generation patterning, whether based on photo or imprinting, uses masks or templates, typically fabricated by electron-beam lithography. Many of these templates or masks are being fabricated with the hard mask HSQ (hydrogen silsesquioxane). HSQ masks are widely used for fabricating a variety of electronic, data storage, and microelectromechanical devices. HSQ is also under development as a hard master/template for imprint lithography.

Figure 14:
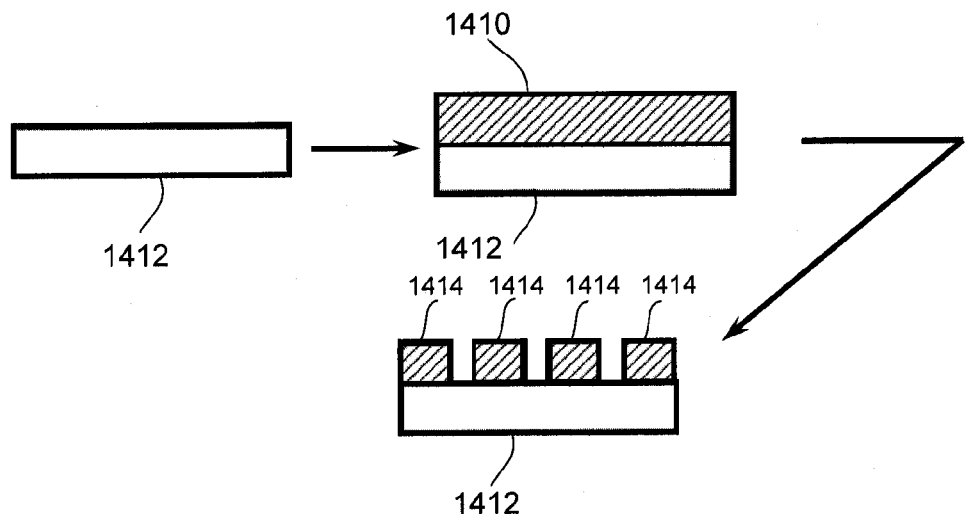
FIG. 14 is a schematic diagram illustrating a single layer process for producing a patterned film on a substrate.
Figure 15:
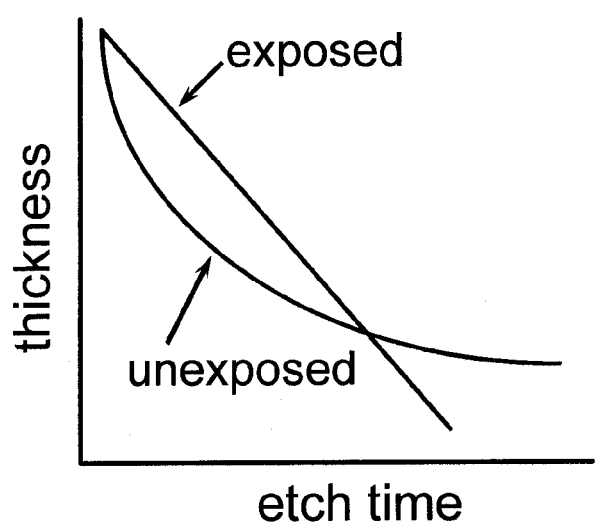
FIG. 15 is a graph of thickness versus etch time for a thermally pre-treated, single-layer film.

Masks or templates can be fabricated using the films described herein in a single layer process as shown in FIG. 14. The first step of the process involves depositing a thin film (from about 1 nm to about 100 nm) of an inorganic precursor 1410 onto a substrate 1412. The inorganic precursor 1410 may be a solid acid or base, e.g., hydrated sulfate, phosphate, nitrate, silicate, aluminate, borate, or mixtures thereof, containing one or more of the metals Sc, Ti, V, Cr, Mn, Fe, Co, Ni, Zn, Y, Zr, Nb, Mo, In, Sn, Sb, Hf, Ta, W, Ir, Pt, La, Ce, Pr, Nd, Pm, Sm, Eu, Gd, Tb, Dy, Ho, Er, Tm, Yb, or Lu in combination with peroxide or similar coordinating anion. In addition the solid acid/base and peroxide mixture can contain one or more of $NH_3$, OH, F, Cl, Br, I. The solid acid/base is preferably deposited via spin coating, liquid misting, or printing; physical and vapor deposition are additional options. As one example, the solid acid can be deposited from an aqueous solution of $HfOCl_2$ $H_2SO_4$(aq), and $H_2O_2$(aq) via spin coating. The solid acid is heated sufficiently, such as to a temperature of from about 50° C. to about 125° C., and for a period of time from about 10 seconds to about 10 minutes to produce a structurally rigid film. The film is then exposed through a photomask or via a defined laser or electron beam to induce condensation in the exposed areas. The solubility of exposed areas 1414 decreases relative to unexposed regions, so the unexposed regions can be selectively etched in acid or base. Examples of acids or bases that can be used include hydrochloric acid, sulfuric acid, hydroxygen peroxide, sodium hydroxide, and tetramethyl ammonium hydroxide, among others. Typically, the concentration of the acids or bases used is within the range of about 0.1 M to about 1 M. The film is then developed in aqueous acid or base to etch the unexposed regions following an optional thermal cure at a temperature greater than about 100° C. This process produces a negative-tone image in the film. For many compositions, the resulting patterned films are amorphous, providing the means to realize high-resolution, small critical-dimension patterning without the limitations generally associated with crystalline films. By preheating the applied film to higher temperatures prior to field exposures, differential etching rates can be induced to realize positive-tone images. FIG. 15 demonstrates differential etching rates for thermally pre-treated, single-layer film.

The graph demonstrates that thermal treatment affects etching rates such that exposed regions etch faster than unexposed regions following an initial time.

In another embodiment, a HafSOx film is treated with a mixture of sodium hydroxide and hydrogen peroxide, resulting in anion exchange and formation of a $M(OH)_x/H_2O_2$ film. Alternatively, a previously prepared $M(OH)_x$ film may be soaked in hydrogen peroxide to form a $M(OH)_x/H_2O_2$ film. The resulting $M(OH)_x/H_2O_2$ film is then patterned by exposure to light or an electron beam. These techniques provide a means for directly patterning simple of complex $MO_x$ films without a polymer resist. For example, $HfO_2$ films may be directly patterned for use as high k dielectrics in Si CMOS circuits and printed electronics applications. In another example, a patterned $TiO_2$ film can be produced from a $Ti(OH)_x/H_2O_2$ film formed by solution deposition of $Ti(OH)_4$ in $H_2O_2$.

Figure 16:
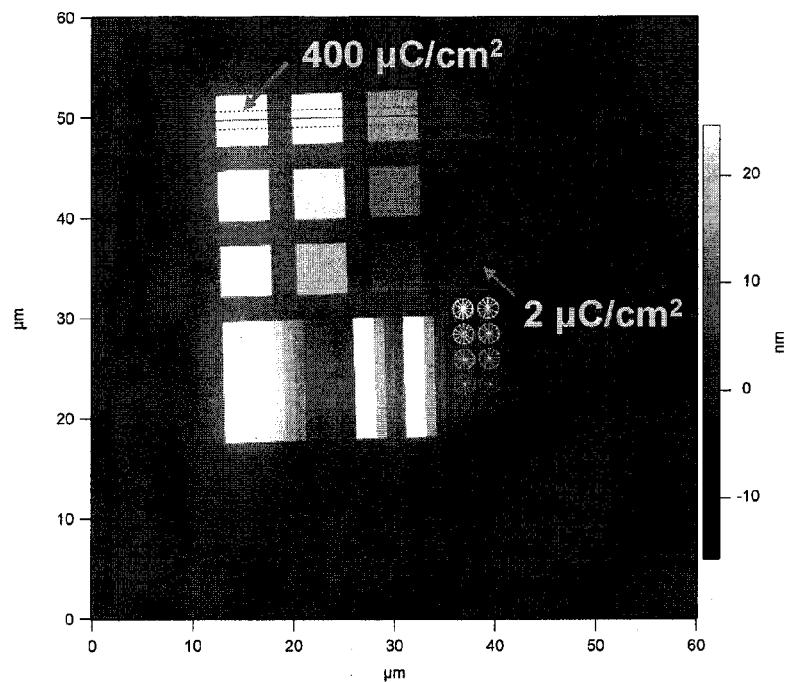
FIG. 16 is a film patterned by an electron beam.

These methods substantially eliminate diffusion used in two-layer embodiments, lower exposure doses, and improve line-edge roughness and critical dimensions. FIG. 16 is an AFM (atomic force microscope) image of a HafSOx film patterned via a single-layer, negative tone process with an electron beam at dose levels ranging from greater than 0 $\mu C/cm^2$ to at least 400 $\mu C/cm^2$. The nanometer scale to the right of the image indicates the height of the features etched into the film. As shown in FIG. 16, features have been written via electron-beam exposure at dose levels as low as 2 $\mu C/cm^2$. This dose level is comparable to the best known chemically amplified polymer resists and 1000 times lower than that previously demonstrated for an inorganic resist. Features can be produced with a resolution of less than about 20 nm. In addition, the films demonstrate structural integrity (e.g., smooth, dense, pinhole-free) to less than 3 nm, nearly an order of magnitude smaller than that demonstrated for HSQ.

The film application, heating, and etching steps associated with a polymer resist, as well as the vacuum and high-temperature processing steps of the inorganic material, have been eliminated in the patterning process. The resulting patterned film could be a functional component of an electronic device, a hard mask for subsequent patterning of the underlying substrate, or a template for imprinting. Except for the electron-beam exposure, all processing is conducted in a normal environment in air. Considering the elimination of several processing steps, the disclosed technique provides a new method to improve device production yields and lower fabrication costs. Relying on the exclusive use of aqueous chemistries, the process is also environmentally green, and washed products can be completely recovered and recycled. The technique has applications to many advancing technologies. Its use is not restricted only to the systems described herein.

B. Imprint Lithography

Hot embossing and photo-initiated imprint lithography are additional methods for producing patterns in HafSOx, ZircSOx and related materials. The hot-embossing process, illustrated schematically in FIG. 17, most commonly has been applied to creating patterns with organic polymers. The semi-solid form of HafSOx and related compositions provides an opportunity to pattern inorganic materials having much higher mechanical strength, chemical stability, and unique electrical and optical properties relative to organic polymers.

Figure 17:
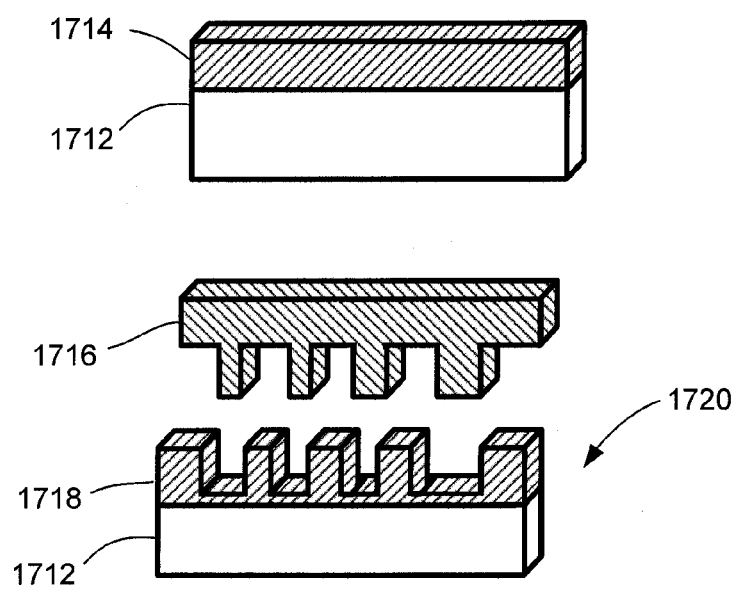
FIG. 17 is a schematic diagram illustrating hot embossing lithography for use with semi-solid forms of compounds disclosed herein having much higher mechanical strength, chemical stability, and unique electrical and optical properties relative to organic polymers.

With reference to FIG. 17, HafSOx or related inorganic material, instead of an organic polymer, is solution deposited, such as by spin coating or inkjet printing, on a suitable substrate 1712 to form HafSOx layer 1714. Substrate 1712 and HafSOx layer 1714 define laminate structure 1710. A stamp 1716 with unit features of desired size scale, such as nanometer, micrometer or millimeter size scale, is pressed into the semi-solid HafSOx or related film layer 1714 to form stamped layer 1718. Stamped layer 1718 and substrate 1712 are then heated to harden the HafSOx. The stamp is then removed to define a patterned HafSOx material in patterned laminate structure 1720.

Alternatively, peroxide or related small, weakly coordinating ligand can be added to HafSOx, ZircSOx, and related materials. Subsequently, during the stamping step, the film can be exposed to short wavelength light, promoting chemical condensation and hardening of the patterned film. The stamp is then removed to define a pattern film. This technique represents a new innovation in step-and-flash imprint lithography (SFIL) that is commonly used to imprint polymer materials.

C. Measuring Device

Figure 18:
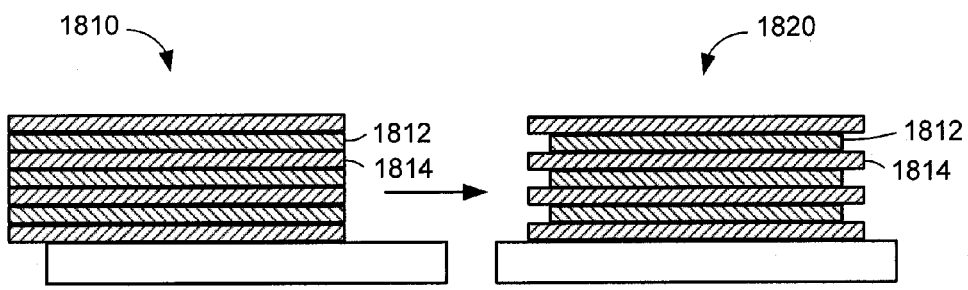
FIG. 18 is a schematic diagram illustrating one method for making a physical ruler for use in standardizing measurements in applications, such as electron microscopy.

The chemistry developed for the bilayer positive resist technology noted above also can be used to fabricate a physical ruler, as illustrated in FIG. 18, for use in standardizing measurements in suitable fields, such as electron microscopy. In this application, a nanolaminate 1810 of alternating acid-soluble layers 1812 and acid-insoluble layers 1814 is deposited. The acid soluble layers are formed by solution deposition of a hafnium and/or zirconium oxy hydroxy sulfate $(MO_{2-x-z/2}(OH)_z(SO_4)_x)$ compound, hafnium and/or zirconium oxy hydroxy tungstate $(MO_{2-x-z/2}(OH)_z(WO_4)_x)$ compound, hafnium and/or zirconium oxy hydroxy borate $(MO_{2-3x/2-z/2}(OH)_z(BO_3)_x)$ compound, a hafnium and/or zirconium oxy hydroxy phosphate $(MO_{2-3x/2-z/2}(OH)_z(PO_4)_x)$ compound, and/or hafnium and/or zirconium oxy hydroxy silicate $(MO_{2-2x-z/2}(OH)_z(SiO_4)_x)$ compound, where M is hafnium or zirconium, x and z may be fixed or variable, and have any value for x in a range of from about 0.1 to about 3.5/(polyatomic ion charge), and any value for z in a range of from 0.0 to 3.8. Typically this layer is doped with copper. The acid-insoluble layers are formed by solution deposition of a hafnium and/or zirconium oxy hydroxy sulfate $(MO_{2-x-z/1}(OH)_z(SO_4)_x)$ compound, hafnium and/or zirconium oxy hydroxy tungstate $(MO_{2-x-z/2}(OH)_z(WO_4)_x)$ compound, hafnium and/or zirconium oxy hydroxy borate $(MO_{2-3x/2-z/2}(OH)_z(BO_3)_x)$ compound, a hafnium and/or zirconium oxy hydroxy phosphate $(MO_{2-3x/2-z/2}(OH)_z(PO_4)_x)$ compound, and/or hafnium and/or zirconium oxy hydroxy silicate $(MO_{2-2x-z/2}(OH)_z(SiO_4)_x)$ compound, where M is hafnium or zirconium, x and z may be fixed or variable, and have any value for x in a range of from about 0.1 to about 3.5/(polyatomic ion charge), and any value for z in a range of from 0.0 to 3.8.

The widths of the layers 1812 and 1814 are accurately determined, such as by using X-ray reflectivity. The acid-soluble layers 1812 are then etched to reveal a finger-type pattern 1820 that can be used as a secondary reference in accurately measuring objects in an electron microscope.

D. Corrosion Barriers

The precursor liquid can be coated onto a suitable substrate, such as a metal or alloy or ceramic, to form a corrosion barrier. In addition, the liquid can be drawn into fibers, placed in a mold, or used alone. The liquid is converted into solid, stable form by any suitable process, including hydrolysis, annealing, or pyrolysis in air. Typically, this requires heating to temperatures, and for a period of time, effective to achieve the desired results, such as a temperature normally above 100° C. for at least a few seconds, more typically at least a few minutes.

Because of the atomically dense nature of the films, potential applications include, but are not limited to, thermal, corrosion and oxidation protection for metals and metal/ceramic-based thermal protection systems, organic-based displays and electronics, solar cells, high emissivity coatings, interface coatings for oxide-based ceramic matrix systems, protective coatings on phosphors, environmental barrier coatings for metal and ceramic-based systems, fibers for composites and fiber lasers, corrosion protection in molten metal processing, monolithic materials for thermal insulation, catalyst supports, as well as many others. The ability to laminate the films provides an opportunity to randomize the location of defects in one layer relative to another, providing enhanced corrosion protection.

E. Optical Coatings

The precursor liquids can be coated as individual layers and in multilayer formats onto suitable optical substrates to produce antireflection coatings, dielectric mirrors, X-ray mirrors, interference filters, waveguides, planar coatings, and scratch-resistant surfaces. Multilayer periodicity is achieved by alternately depositing at least two material compositions. Single layer periodicity can be achieved by etching, as described for photolithography processes. The amorphous nature, sharp interfaces between layers, and abilities to control dielectric constants provides a process for realizing performance near theoretical limits.

In multilayer or single layer configurations, which have been selectively deposited or etched, the periodic structure is appropriate for diffracting applications. Combinations of single or multiple materials and/or voids may define the structures. The use of void space allows for great contrast of physical properties within given structures. Functional characteristics may be enhanced or realized by the use of void space. Optical gratings may be similarly defined.

Because substantially smooth surface films can be deposited according to embodiments of the method disclosed herein, films may be used to planarize substrate layers such as metal, ceramics, and plastics that exhibit greater degrees of roughness.

F. Luminescent Films

A material may absorb energy and emit photons in a number of luminescent processes. The luminescent events may involve only the predominant phase (or host), or also may include added elements. A single material may serve as host for numerous luminescent additives. Many of the disclosed film compositions are visibly transparent with transparency potentially extending into the ultraviolet portion of the spectrum. These materials potentially function well as luminescent host materials. These materials can be selectively doped with common luminescent ions, including by way of example, and without limitation, $Mn^{2+}$, $Sb^{3+}$, $Sn^{2+}$, $Bi^{3+}$, $Eu^{3+}$, $Tb^{3+}$, $Eu^{2+}$, $Gd^{3+}$, $Tm^{3+}$, and combinations thereof, to yield light-emitting films of interest for lighting and display applications.

G. Printed Electronics

Manufacturers are seeking new, efficient fabrication methods that eliminate the limitations of conventional vapor deposition and lithographic processing. Printing and related maskless techniques are widely regarded as paths forward for realizing advancement in manufacturing efficiencies for back-plane electronics.

The disclosed solution-processed thin films exhibit morphological and device-functional characteristics similar to those achieved by the most advanced vapor-phase processing methods. Solutions of the disclosed compositions can be imprinted, such as with microcontact, gravure, an inkjet printer or other suitable means. The resulting imprinted solutions can be used to fabricate stable inorganic transistor arrays exhibiting device mobilities of about 10 $cm^2$/Vs with dielectric leakage current densities less than about 20 $nA/cm^2$. Dielectric and semiconductor inks also can be printed onto glass substrates to produce transistor arrays having mobility of about 5 $cm^2$/Vs and dielectric leakage currents less than about 100 $nA/cm^2$. MIM capacitor arrays can be fabricated with relative dielectric constants greater than about 5 and leakage current densities less than about 50 $nA/cm^2$.

IV. EXAMPLES

The following examples are provided to exemplify particular features of working and/or hypothetical embodiments of the present invention. A person of ordinary skill in the art will appreciate that the scope of the present invention is not limited to the particular features stated in such examples.

Example 1

This example describes a general method that has been used to prepare solutions as sources for bulk precipitates or for use as thin film precursors. The following reagents were used: $HfOCl_2 \cdot 8H_2O$ (Alfa Aesar, 99+% excluding 1.5% Zr); $ZrOCl_2 \cdot 8H_2O$ (Wah Chang spectrographic grade); $La_2(SO_4)_3$ (Alfa Aesar, 99.9%); $La(NO_3)_3 \cdot 6H_2O$ (Johnson Matthey, 99.9%); $Ce_2(SO_4)_3 \cdot 8H_2O$ (Strem, 99%); CaO (Alfa Aesar, 99.95%); $(NH_4)_2SO_4$ (Mallinkrodt A R); $H_2SO_4$(aq) (EM Science, GR ACS, 95-98%); and $NH_3$(aq) (EM Science, GR ACS, 28-30%). All solutions were prepared by combining $HfOCl_2$ or $ZrOCl_2$ with $La_2(SO_4)_3$, $Ce_2(SO_4)_3$, or CaO as necessary for a total metal concentration of about 0.8 M, followed by addition of sulfate solution, for a total metal concentration of about 0.5 M. These solutions were directly used for heat-induced precipitation and spin-coating dielectric films. Additional modifications were made as necessary to serve as precursors for hydroxide precipitation reactions or nanolaminate depositions.

Example 2

This example describes a general method that has been used for bulk precipitation from solutions made according to Example 1. Precipitation was induced by immersing tubes of solution in a boiling water bath for 40 minutes. For hydroxide-induced precipitation, $HfOCl_2$ and $La_2(SO_4)_3$ were mixed as 23% La (metal percent), followed by addition of solutions of $La(NO_3)_3$ and $(NH_4)_2SO_4$ to provide a hafnium concentration ([Hf]) of about 0.39 M, a lanthanum concentration ([La]) of about 0.18 M, and a sulfate ([$SO_4$]) concentration of about 0.42 M. 1.9 mole equivalents (relative to total metals) of saturated $NH_3$(aq) were then added quickly and the resulting mixture stirred for 1 minute. All precipitates were separated from the supernatant by paper filtration with suction, including several rinses with de-ionized water. The filtrates were dried at room temperature for 1 day. Samples were subsequently heated in alumina crucibles in ambient air at temperatures from about 100° C. to about 1,500° C. for about 1 to about 4 hours. XRD data was collected with a Siemens D5000 diffractometer, utilizing Cu Kα radiation. Thermogravimetric data were collected with a Shimadzu TGA-50 by heating samples (10-20 mg) in a Pt crucible under flowing $N_2$(g), typically at a rate of 10° C. $minute^{-1}$, and holding for 15 minutes at the highest temperature. Inductively coupled plasma atomic emission spectroscopy (ICPAES) was conducted with a Jobin Yvon JY2000 analysis setup. Samples were dissolved in digestion bombs at 200° C. for a few hours and diluted to measurable levels.

Example 3

This example describes a general method that has been used for deposition of thin films using solutions made according to Example 1. Thin-films of HafSOx, ZircSOx, and derivatives with added La, Ce, or Ca, were deposited on Si substrates by spin-coating at 3,000 rpm for 30 seconds, followed by immediate hotplate polymerization at 135° C. for 1.5-2 minutes (additional heating on a 325° C. oven surface for 15 seconds to about 2 minutes may be required for certain derivatives). This process was repeated until desired deposited film thicknesses were obtained. A final oven anneal at 325° C. for 5-10 minutes was used.

Precursors for nanolaminate films were prepared by adding $H_2SO_4$ to $HfOCl_2$ or $ZrOCl_2$ as 46% sulfate relative to metal. Solutions were diluted to a metal concentration of 0.03-0.13 M. Alternating layers of HafSOx and ZircSOx were deposited in the same fashion as described for dielectric films.

The silicon substrates had a surface of $SiO_2$ or Ta metal. A 500-nanometer Ta surface was used for dielectric testing. A 200-nanometer $SiO_2$ surface was used for all other purposes. The surfaces were prepared for deposition by ultrasonic cleaning in (Decon Labs, Contrad 70) solution at 45° C. for 45 minutes, then rinsing the surfaces thoroughly with Millipore water before deposition.

XRD data were collected with a Rigaku RAPID diffractometer, employing Cu Kα radiation generated from a rotating anode at 50 kV and 270 mA. The incident beam angle was 7.6°, while the diffracted beam was collected with an image plate. XRR data were collected with Cu Kα radiation. Low angle reflections up to 10° (2θ) were collected at 0.005° steps. Transmission FTIR data were collected with a Nicolet 5PC spectrometer, with an uncoated substrate as reference. EPMA was collected.

MIM capacitor structures were completed by thermally evaporating circular contacts of Al (1.2 mm diameter) on deposited dielectrics. Parameters of dielectric constant and loss tangent were obtained. Bottom-gate transistor structures also were fabricated by sputtering inorganic channel materials without active heating. ZTO-channel devices were subsequently heated to 325° C. for 1 hour. Aluminum source and drain contacts were thermally evaporated. Transistor characterization was performed.

Example 4

This example describes a general method for producing smooth, dense, and pinhole-free ultra-thin nanolaminate films as thin as about 2 nm. Precursor solutions containing $HfOCl_2.8H_2O$ or $ZrOCl_2.8H_2O$, $H_2O_2$ (30%) and $H_2SO_4$(aq) were prepared as described in U.S. Patent Publication No. 2005/0242330 A1. The precursor solutions contained a metal ion concentration of about 0.05 M to 0.4 M with 70% $H_2O_2$ and 50% sulfate relative to metal. The difference in metal ion concentrations allowed for thickness per coat variation from 3 nm to 25 nm. Thin films were deposited on silica substrates with thermally grown $SiO_2$. Substrates were cleaned by using an ultrasonic bath with Contrad-70 solution at 45° C. for 60 minutes followed by a rinse with deionized water. Films were deposited by using a spin coater with a spin rate of 3000 rpm for 30 seconds followed by hotplate polymerization at 125° C. for 1-2 minutes. Spin-coating and polymerization steps were repeated until the desired thickness was reached. After the desired thickness had been reached, some films were heated to crystallization temperature. Other films were first treated in a 0.1 M-0.5 M NaOH bath for 1-2 minutes, then rinsed in a deionized water bath for 1-2 minutes before the thermal treatment.

Thin-film characterization using X-ray diffraction (XRD) analysis was performed on a Rigaku R-AXIS RAPID with Cu Kα radiation. Atomic force microscopy (AFM) measurements were performed using a Digital Instruments Nanoscope III Mulitmode AFM operated in contact mode with a Veeco NP-20 SiN probe and a scan frequency of 1.15 Hz. X-ray reflectivity (XRR) measurements were performed using a Bruker Discover D8 and used to determine surface and interfacial roughness of the films. Compositional analyses were acquired on a Cameca SX-50 electron microprobe equipped with 4 tunable wavelength dispersive spectrometers. Accelerating voltages of 12, 16 and 22 kV were used and averaged over 5 points to monitor O, Cl, Na, S, and Si Kα intensities and Zr and Hf Lα intensities. Standards used for analysis were MgO, Hf, Zr, $FeS_2$ (pyrite), $Ca_5(PO_4)_3Cl$ (apatite), Si, and $Si_3AlNaO_8$ (albite). Corrections to the raw intensity were made by using Probe for Windows automation and analysis package. The StrataGEM compositional analysis software package was used for thin film geometry corrections by comparing experimental K-ratios to simulated values.

Figure 19:
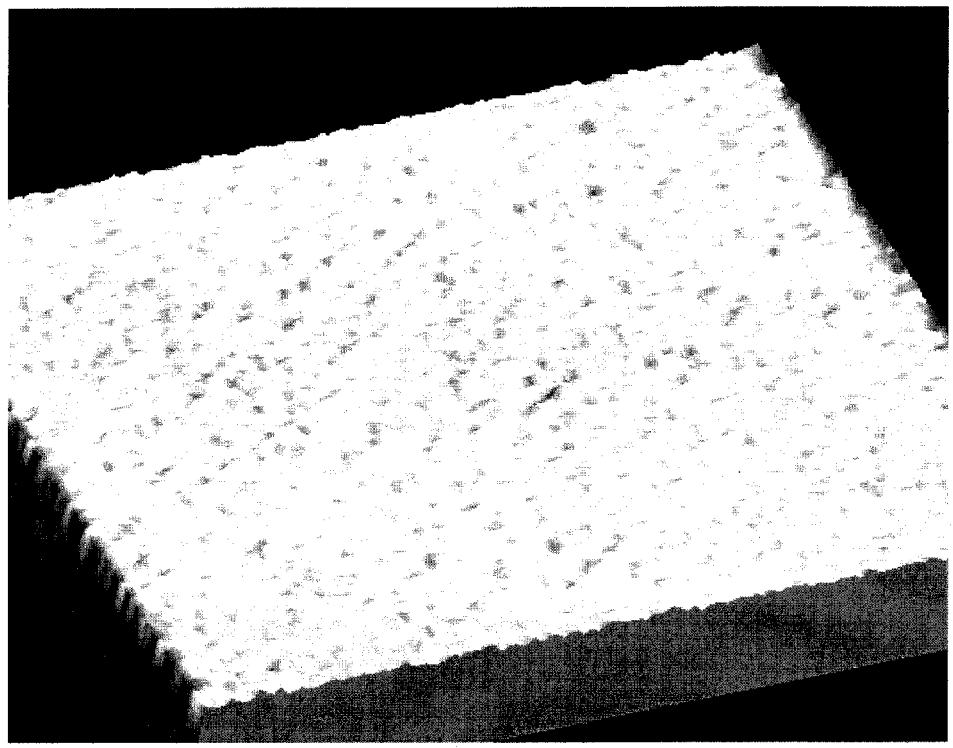
FIG. 19 is an AFM image of an unexchanged HafSOx film deposited on silica.
Figure 20:
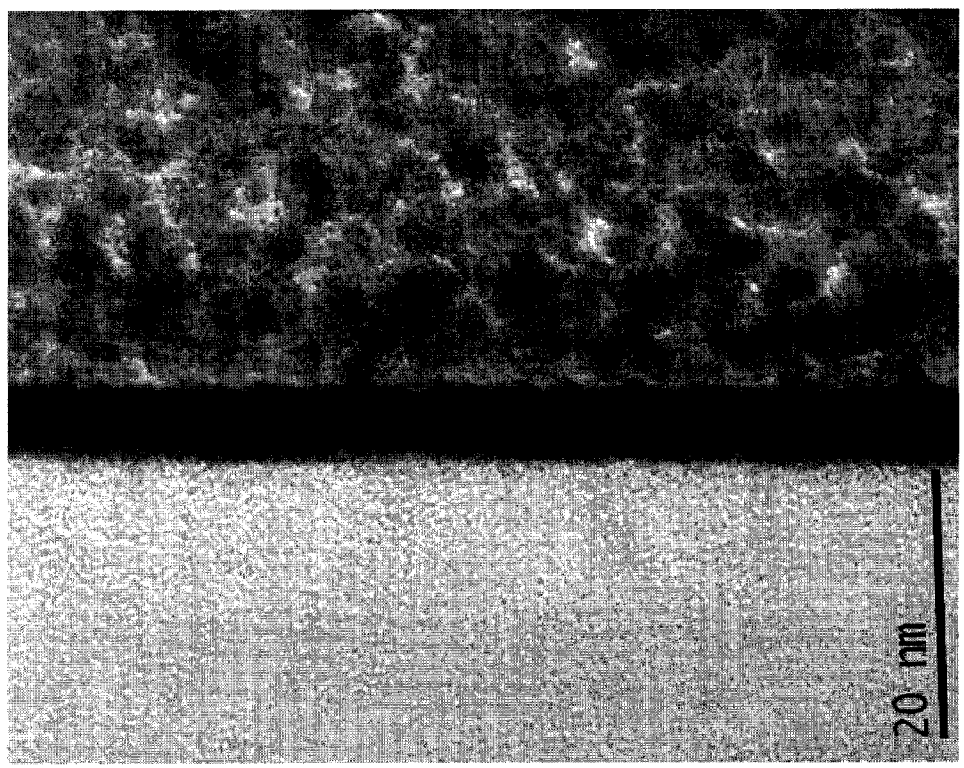
FIG. 20 is a TEM image of $HfO_2$ following ion exchange of HafSOx and thermal treatment at 850° C.
Figure 21:
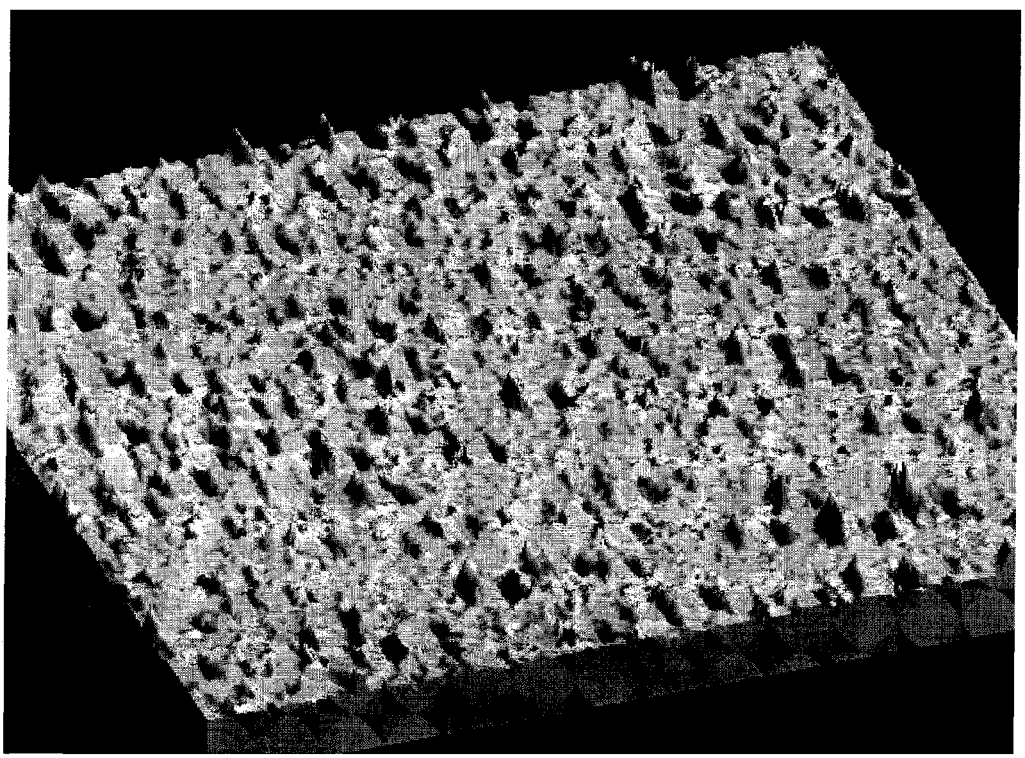
FIG. 21 is an AFM image of a $HfO_2$ film deposited on silica and formed from HafSOx thermal decomposition after heating above 700° C.

Amorphous, atomically flat, dense, pinhole-free thin films were deposited via spin coating for the as-deposited and exchanged films. FIG. 19 is an AFM image of an unexchanged HafSOx film with a roughness of about 0.1 nm. FIG. 20 is a TEM image of an $HfO_2$ film following ion exchange of HafSOx and thermal treatment at 850° C. Unexchanged films remained smooth and amorphous up to 600° C. for Zr and 650° C. for Hf. However, after heating above these temperatures, films crystallized and became rough, forming volcano-like features at the surface. FIG. 21 is an AFM image of a $HfO_2$ film deposited on silica. The $HfO_2$ film was formed by thermal decomposition of $HafSO_x$. The resulting film had a roughness of about 5 nm, resulting in volcano-like peaks. These features were most likely caused by the loss of $SO_3$. This was supported by thermal gravimetric analysis of Hf sulfate powder, where sulfate decomposition ($SO_3$ (g)→$SO_2$ (g) and ½ $O_2$ (g)) occurs above 700° C.

To eliminate the volcano effects, films were treated in a 0.1-0.5 M NaOH(aq) bath for 1-2 minutes to remove the $SO_4^{2-}$ and $Cl^-$ anions from the film before heating. NaOH previously has been shown to effectively exchange hydroxy anions for other anions in zirconium salts. The NaOH treatment caused a thickness reduction of 40-45% (giving layer thickness of 2-15 nm), but the treatment had little effect on the smoothness (~1 Å) or amorphous nature of the films when heated below 500° C. or 550° C. for zirconia and hafnia, respectively.

Figure 22:
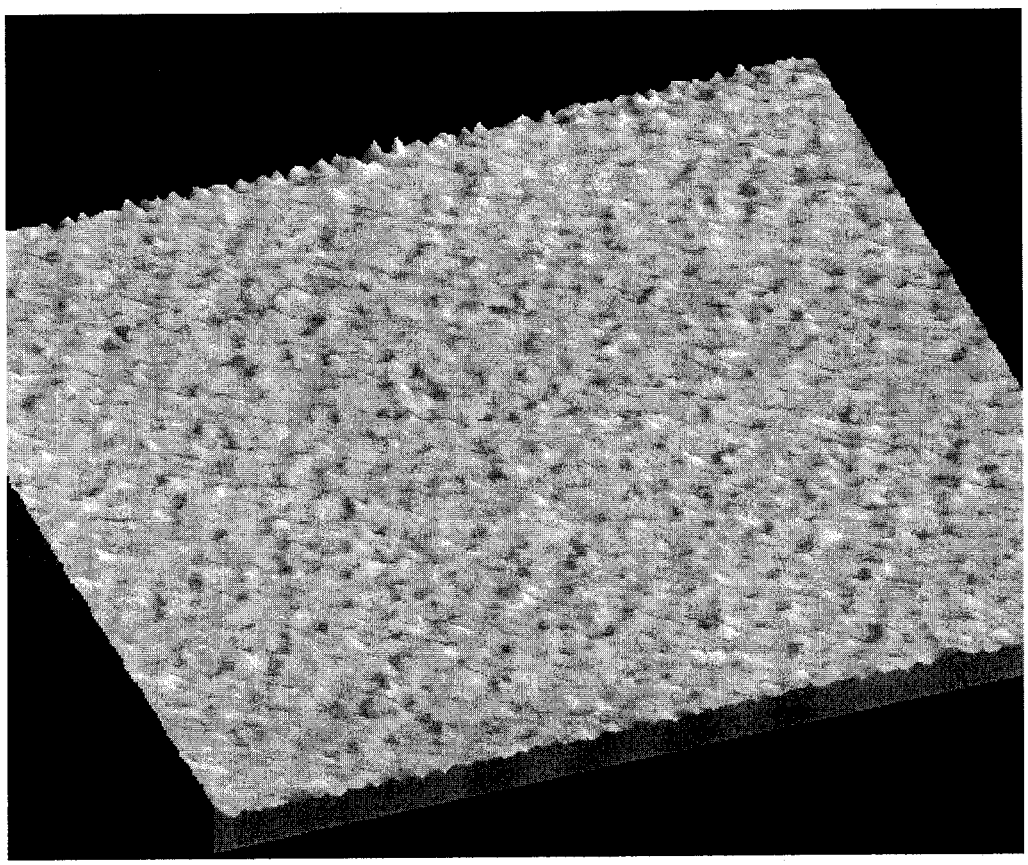
FIG. 22 is an AFM image of a HafSOx film deposited on silica, treated with 0.1M NaOH, and heated to 450° C. for 10 minutes.

FIG. 22 is an AFM image of a HafSOx film deposited on silica, subsequently treated with 0.1 M NaOH and heated to 450° C. for 10 minutes. The resulting film had a roughness of approximately 0.1 nm. Films heated above these temperatures crystallized, yet remained smooth at temperatures up to 850° C.

Figure 23:
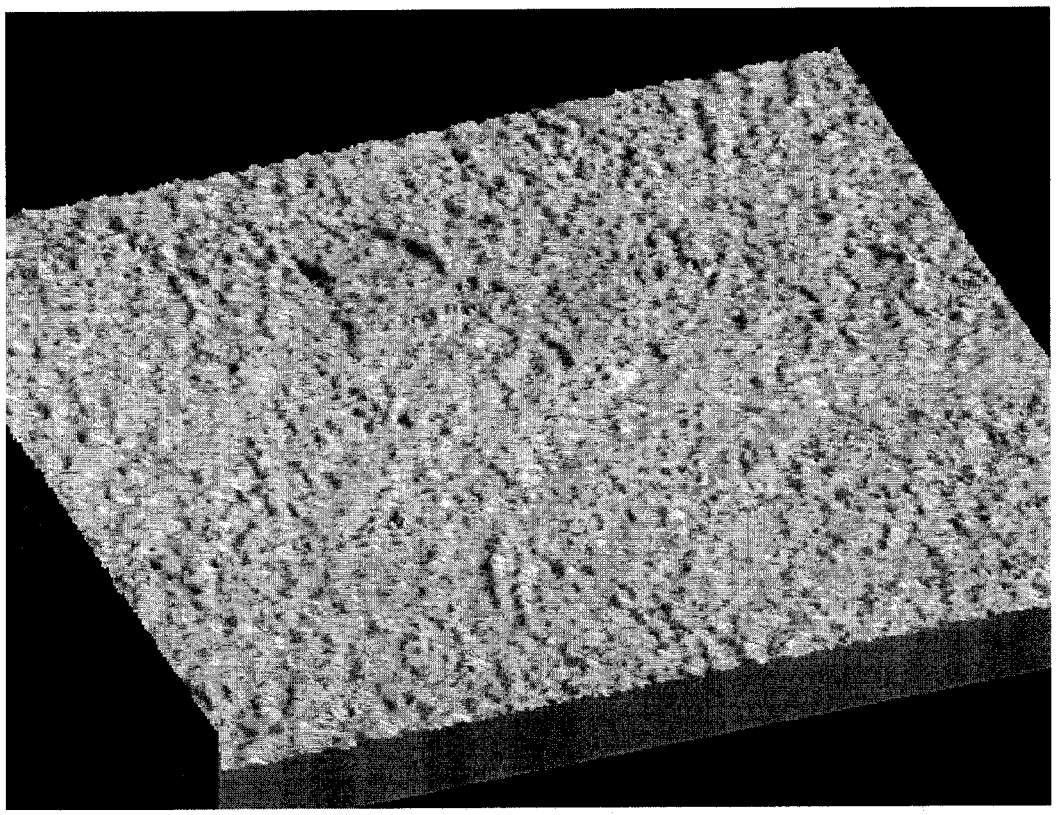
FIG. 23 is an AFM image of a $HfO_2$ film deposited on silica, treated with 0.1M NaOH and heated to 850° C. for 10 minutes.

FIG. 23 shows a $HfO_2$ film deposited on silica, subsequently treated with 0.1 M NaOH and heated to 850° C. for 10 minutes. The resulting crystallized film remained smooth with a roughness of about 0.2 nm.

Figure 24:
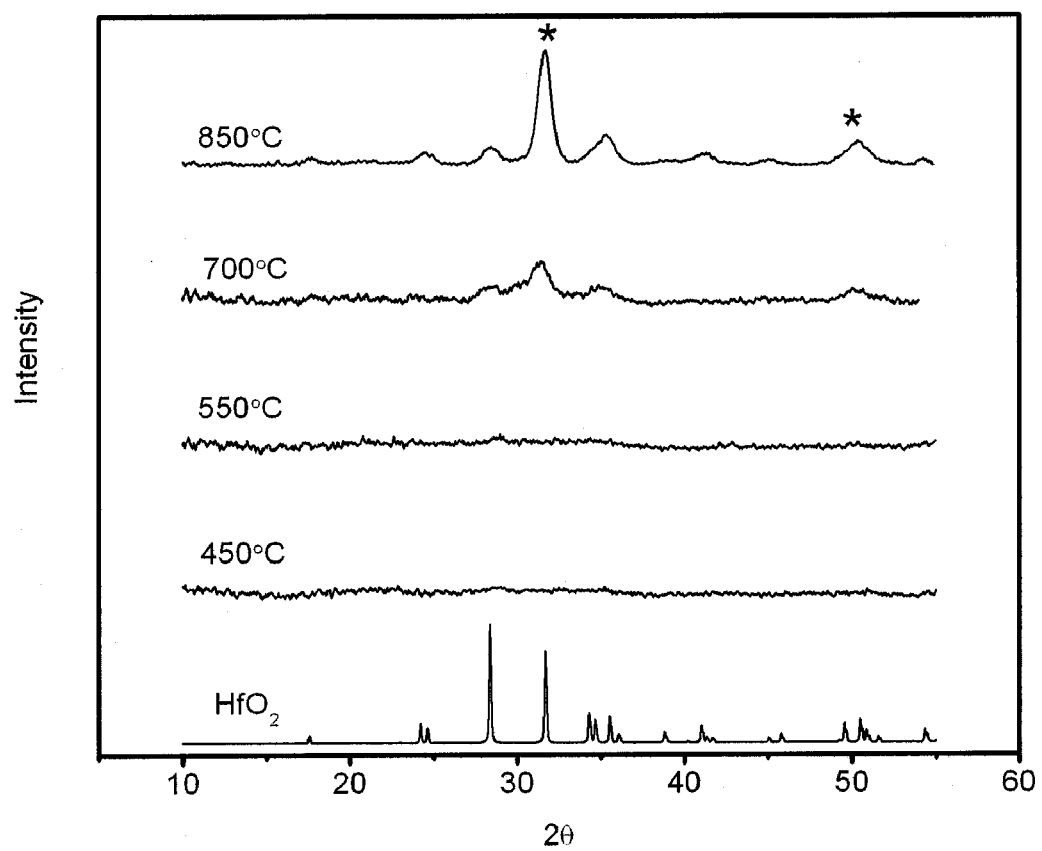
FIG. 24 provides XRD plots of untreated hafnia films.
Figure 25:
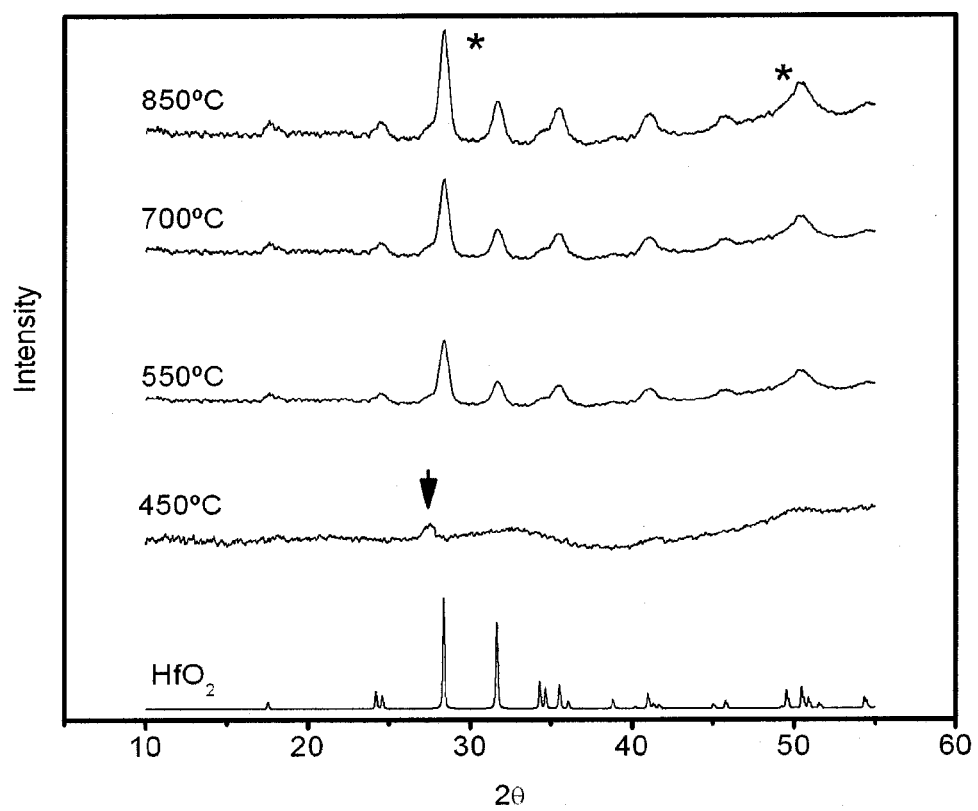
FIG. 25 provides XRD plots of treated hafnia films.
Figure 26:
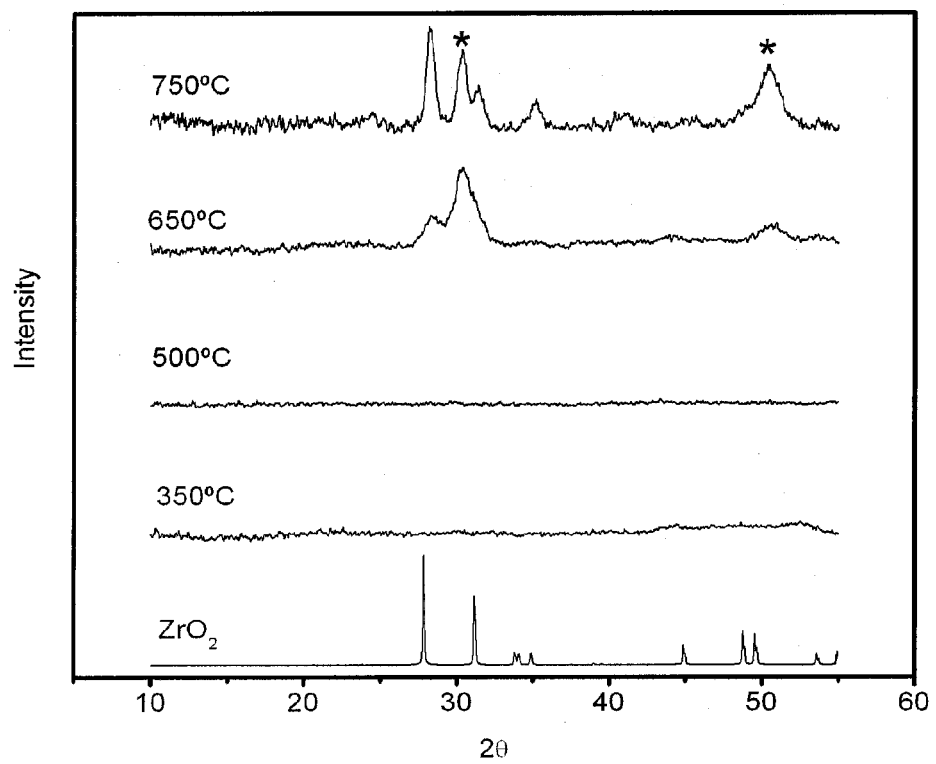
FIG. 26 provides XRD plots of untreated zirconia films.
Figure 27:
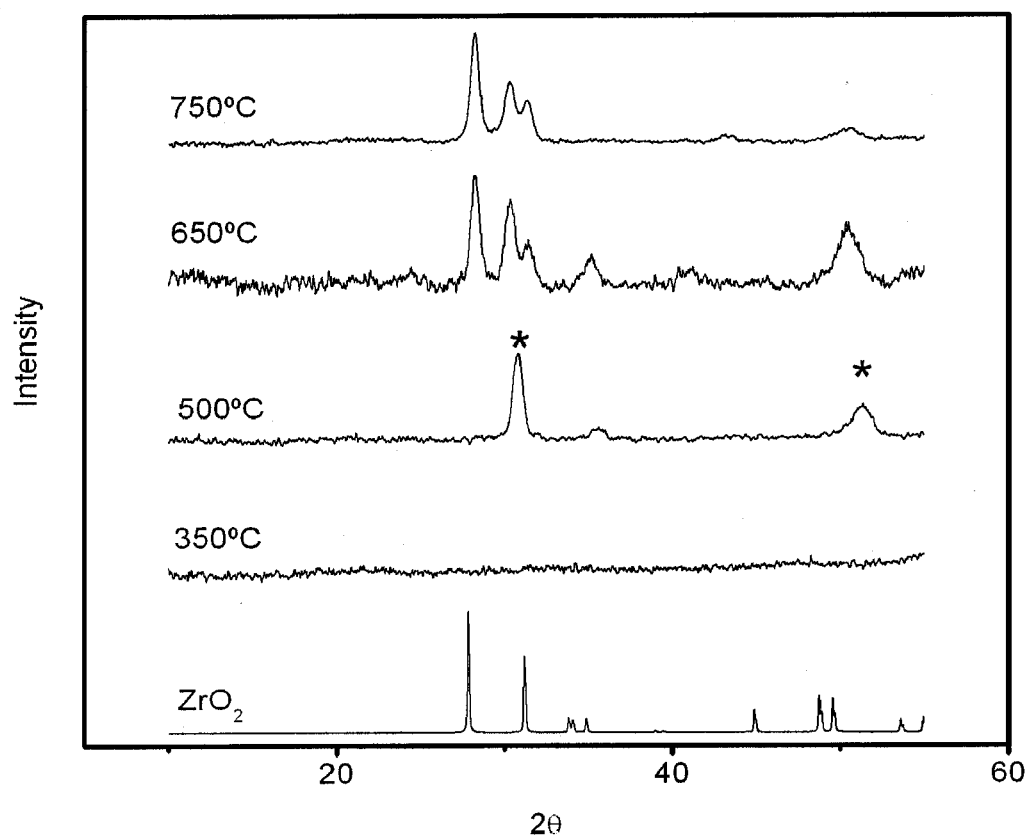
FIG. 27 provides XRD plots of treated zirconia films.

A drop in crystallization temperature was seen in the X-ray diffraction plots (FIGS. 24-27). In FIGS. 24-27, the substrate peaks have been removed with software. The *'s represent the major tetragonal phase peaks. FIG. 24 is an XRD plot of the untreated $HfO_2$ film crystallized as a mixture of tetragonal and monoclinic phases at 700° C. The $HfO_2$ plot is a reference plot for the monoclinic phase. In contrast, FIG. 25 is an XRD plot of the 0.1 M NaOH-treated hafnia film crystallized only in the monoclinic phase at 550° C. The $HfO_2$ plot is a reference plot for the monoclinic phase. FIG. 26 is an XRD plot of untreated zirconia films crystallized in a mixed monoclinic and tetragonal phase at 650° C. The $ZrO_2$ plot is a reference plot for the monoclinic phase. As seen in FIG. 27, the 0.13 M NaOH-treated zirconia films crystallized only in the tetragonal phase at 500° C. Upon further heating, films developed both monoclinic and tetragonal phases. The tetragonal phases of $HfO_2$ and $ZrO_2$ have been observed in previous thin film studies. The lower crystallization temperature, crystallization and loss of thickness indicated that the NaOH treatment removed anions ($SO_4^{2-}$ and $Cl^-$) from the thin films.

Electron probe microanalysis (EPMA) of a film deposited from the 0.4 M Hf solution and heated to 350° C. for 5 minutes gave a film with composition $HfO_{1.32}(SO_4)_{0.61}Cl_{0.15}$. The chlorine in the film was a result of kinetic trapping as a consequence of the rapid thermal dehydration. Films that were treated in the NaOH(aq) bath did not have measurable sulfur levels (less than 0.01 atomic percent), and less than 0.3 atomic percent Cl was observed. This confirmed that the sulfur and chlorine were both removed from the films in the NaOH(aq) bath. EPMA also verified that the residual sodium left in the film after the treatment was less than 0.3 atomic percent.

Example 5

Figure 28:
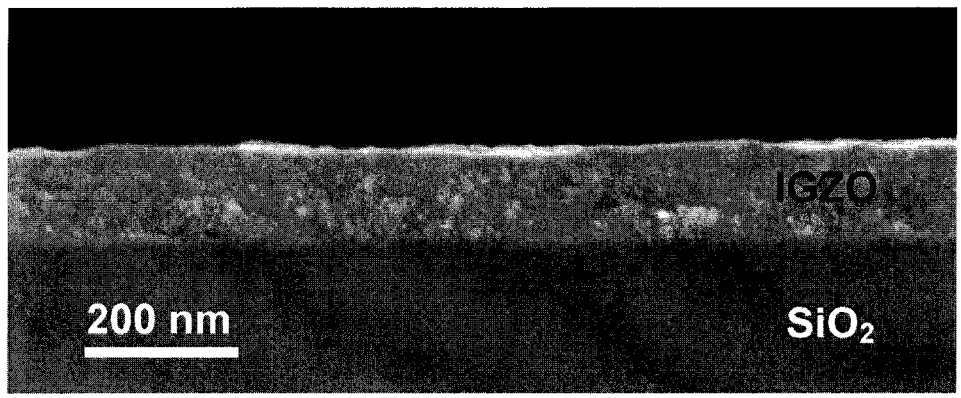
FIG. 28 is an SEM image of an indium gallium zinc oxide semiconductor film deposited on silica.

In a specific embodiment of the approach described above, hydrated indium and gallium nitrate salts ($In(NO_3)_3 \cdot 0.5H_2O$ and $Ga(NO_3)_3 \cdot 9.5H_2O$) were dissolved in methanol ($CH_3OH$). Final concentrations were [In]=0.288 M, [Ga]=0.170 M. Zinc powder was then added to the solution, and the flask sealed. The final concentration of zinc was 0.2 M. Reacting over a period of 1-7 days, the powder was slowly oxidized and dissolved to bring the total metal ion concentration to 0.658 M. The methanolic solution was exposed to air, and the methanol was allowed to evaporate at room temperature. The solid residue remaining in the solution was then dissolved in $H_2O$ to a total metal concentration of 0.395 M. This precursor solution was spin-coated on a $SiO_2$ substrate with a conductive back contact and annealed to 450° C. for 1-4 hours. Following annealing, a transparent, amorphous $InGa_{0.6}Zn_{0.7}O_{3.15}$ semiconductor film was obtained as shown in the SEM image of FIG. 28. Aluminum source and drain contacts were thermally evaporated onto the oxide semiconductor film through a shadow mask to produce a thin film transistor (TFT). Field effect mobility for these TFTs was shown to exceed 8 cm$^2$ V$^{-1}$ s$^{-1}$.

Example 6

Figure 29:
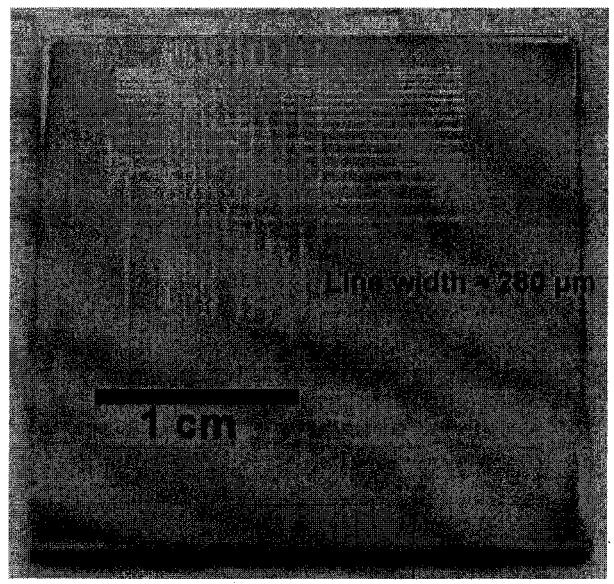
FIG. 29 is a line pattern produced via ink-jet printing and inorganic diffusion-reaction.

This example describes two general methods of bilayer inorganic lithographic processing. In one working embodiment, a HafSOx film with a thickness from about 30 nm to about 60 nm was solution deposited onto a $SiO_2/Si$ substrate. The substrate was placed directly onto a hot-plate set at about 50° C. and heated to impart structural integrity to the film. The resulting film was acid insoluble. The substrate was then placed on a heated platen (about 50° C. to 200° C.) of an ink jet printer, where copper formate lines were printed onto the substrate via a thermal ink jet head. Copper formate decomposed and diffused into the HafSOx film on heating, rendering the film soluble. Following a rinse in water, additional heating to about 300° C., and development in dilute acid, the drawn lines were clearly evident as shown in FIG. 29.

Figure 30:
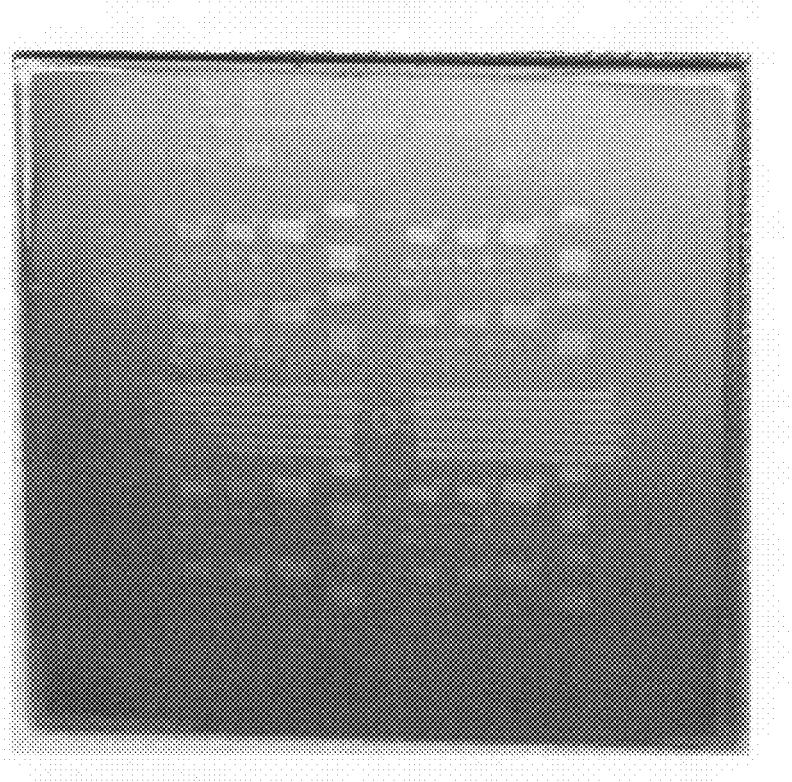
FIG. 30 is a pattern produced by exposing a bilayer film to UV light.
Figure 31:
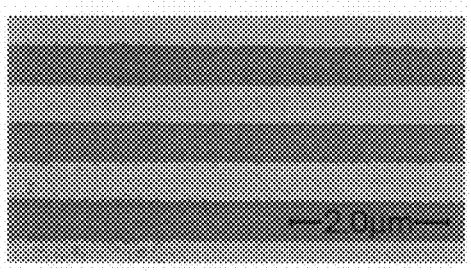
FIG. 31 is a film patterned by electron-beam writing.
Figure 32:
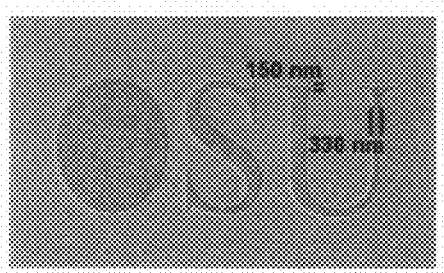
FIG. 32 is a film patterned by electron-beam writing.

In another working embodiment, patterns also were produced via photolithography. Exposure of a $HfO_{2-x}(SO_4)_x$ bilayer film with deep UV light using an unfiltered deuterium lamp promoted copper formate decomposition for subsequent interdiffusion and development of the pattern shown in FIG. 30. Feature sizes were reduced to about 22 nm with electron beam writing. The interdiffusion process can be spatially controlled via electron-beam energies to draw patterns and objects on the nanoscale. Highly resolved patterns were produced at charge dose levels near 150 µC/cm$^2$, representing a sensitivity similar to that of many polymer resists. FIGS. 31 and 32 are two patterns produced by electron-beam writing at a dose of level of about 200 µC/cm$^2$. In FIG. 31, the line spacing is 500 nm as measured by an electron microscope.

Example 7

Figure 33:
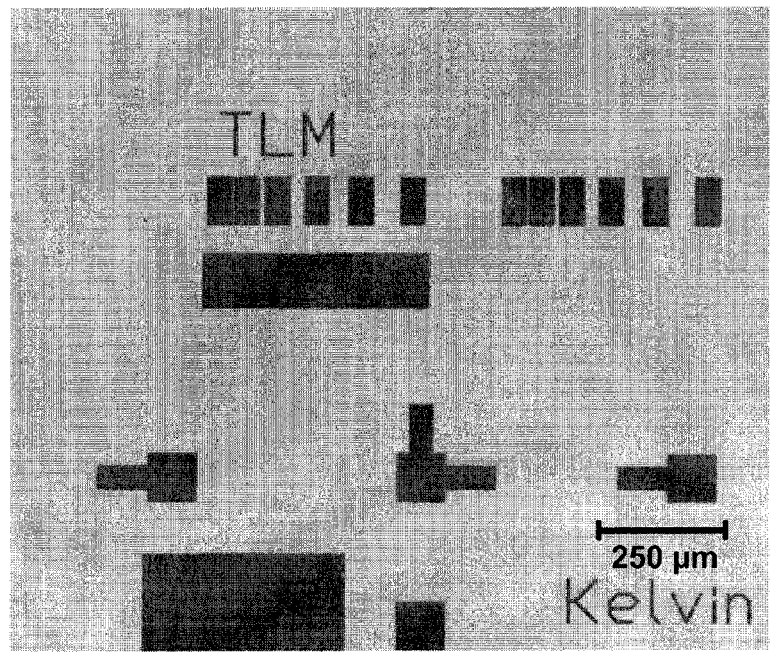
FIG. 33 is a film patterned photographically.
Figure 34:
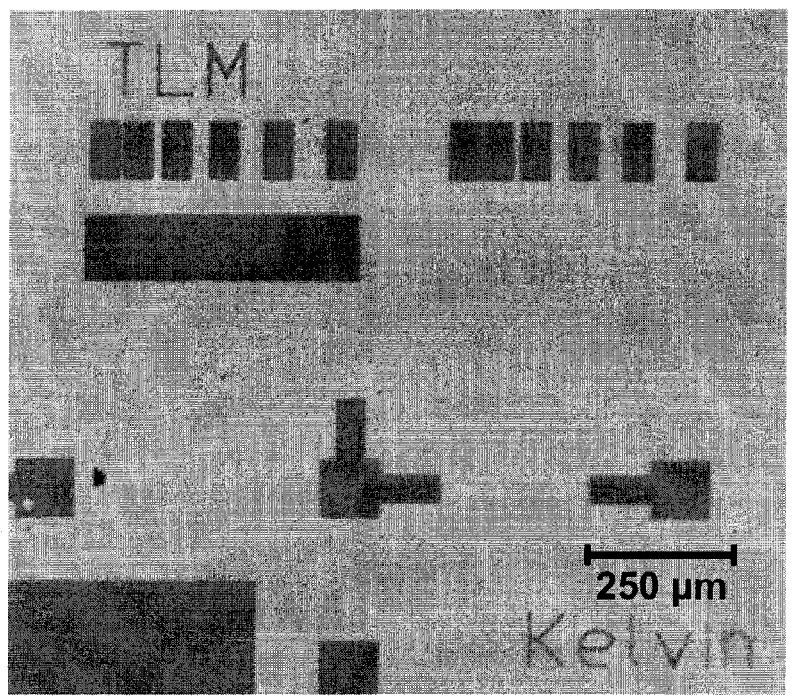
FIG. 34 is a film patterned photographically.

This example describes general methods for patterning a single-layer inorganic film. A single inorganic film containing peroxide or related coordinating species is spin-cast, liquid misted, or ink-jet printed onto an appropriate substrate. The film is heated at modest temperatures of less than 100° C. to provide structural integrity to the film. The film is then exposed through a photomask to high-energy light, a maskless pattern via spatial light modulation, a defined laser beam, or electron beam to define a pattern or other preferred film features. Two examples of photographically patterned films are shown in FIGS. 33 and 34. FIG. 33 is a patterned $ZrO_{2-x}(SO_4)_x$ film. FIG. 34 is a patterned $TiO_2$ film. The $TiO_2$ film was about 15-50 nm thick. It was patterned using an unfiltered deuterium lamp, followed by etching with 0.1-0.2 M HCl for less than 60 seconds. FIGS. 35-37 are $HfO_{2-x}(SO_4)_x$ films patterned by an electron beam. The films were about 30-60 nm thick. They were patterned using an electron beam at a dose level of 200 µC/cm$^2$, followed by etching with 5-12 M HCl for about 1-4 minutes.

In view of the many possible embodiments to which the principles of the disclosed invention may be applied, it should be recognized that the illustrated embodiments are only preferred examples of the invention and should not be taken as limiting the scope of the invention. Rather, the scope of the invention is defined by the following claims. We therefore claim as our invention all that comes within the scope and spirit of these claims.

We claim:

1. An aqueous inorganic patterning composition comprising water, metal suboxide cations, polyatomic anions, and a coordinating species comprising a peroxide group, wherein the composition comprises Cu, Al, Sc, Ti, V, Cr, Mn, Fe, Co, Ni, Zn, Y, Zr, Nb, Mo, In, Sn, Sb, Hf, Ta, W, Ir, Pt, La, Ce, Pr, Nd, Pm, Sm, Eu, Gd, Tb, Dy, Ho, Er, Tm, Yb, Lu or a combination thereof.

2. The aqueous composition of claim 1 wherein the metal suboxide cations comprise $ZrO^{+2}$ cations, $HfO^{+2}$ cations or a combination thereof.

3. The aqueous composition of claim 1 wherein the polyatomic anions comprise tungstate, phosphate, nitrate, silicate, aluminate, borate or combinations thereof.

4. The aqueous composition of claim 1 wherein the polyatomic anion comprises sulfate.

5. The aqueous composition of claim 1 further comprising $NH_3$, $OH^-$, $F^-$, $Cl^-$, $Br^-$, $I^-$, or a combination thereof.

6. A method for forming a pattern of an inorganic material deposited on a substrate by solution deposition, comprising:
   providing a substrate having a coating composition, the coating composition comprising metal suboxide cations, polyatomic anions, and a coordinating species comprising a peroxide group, the coating composition further comprising Cu, Al, Sc, Ti, V, Cr, Mn, Fe, Co, Ni, Zn, Y, Zr, Nb, Mo, In, Sn, Sb, Hf, Ta, W, Ir, Pt, La, Ce, Pr, Nd, Pm, Sm, Eu, Gd, Tb, Dy, Ho, Er, Tm, Yb, Lu or a combination thereof; and
   exposing the coating composition to radiation in a pattern such that first portions of the coating are exposed to the radiation and second portions of the coating are not exposed to the radiation, thereby forming an exposed patterned coating.

7. The method of claim 6 wherein the radiation comprises an electron beam or ultraviolet light.

8. The method of claim 6 wherein exposing the coating composition to the radiation condenses exposed first portions of the coating composition.

9. The method of claim 6 wherein the metal suboxide cations comprise $ZrO^{+2}$ cations, $HfO^{+2}$ cations or a combination thereof, wherein the polyatomic anions comprise sulfate anions, and wherein the coating composition further comprises $F^-$, $Cl^-$, $Br^-$, $I^-$, or a combination thereof.

10. The method of claim 6 further comprising etching after exposure to the radiation to remove unexposed second portions of the coating composition.

11. The method of claim 10 wherein the etching is performed with tetramethyl ammonium hydroxide.

12. The method of claim 6 further comprising heating the coating composition prior to exposure with radiation.

13. The method of claim 6 wherein the coating composition is heated to a temperature above about 100° C. after exposing the coating composition to the radiation pattern and prior to etching the exposed coating composition with an acid or a base to remove unexposed second portions of the coating composition.

14. The method of claim 6 further comprising contacting the exposed coating composition with a composition selected from hydrochloric acid, sulfuric acid, hydrogen peroxide, sodium hydroxide, or tetramethyl ammonium hydroxide, to remove a portion of the material to form the pattern.

15. The method of claim 6 wherein the coating composition has a thickness of from about 1 nm to about 100 nm.

16. The method of claim 15 further comprising developing the exposed coating composition to remove the exposed material.

17. The method according to claim 6 where providing a substrate having a coating composition comprises acquiring the coated substrate.

18. The method according to claim 6 where providing a substrate having a coating composition comprises:
    forming an aqueous composition comprising water, metal suboxide cations, polyatomic anions, and a coordinating species comprising a peroxide group, wherein the composition comprises Cu, Al, Sc, Ti, V, Cr, Mn, Fe, Co, Ni, Zn, Y, Zr, Nb, Mo, In, Sn, Sb, Hf, Ta, W, Ir, Pt, La, Ce, Pr, Nd, Pm, Sm, Eu, Gd, Tb, Dy, Ho, Er, Tm, Yb, Lu or a combination thereof; and
    depositing the aqueous composition onto the substrate.

19. A method for forming an inorganic patterning composition, the method comprising mixing an aqueous solution comprising metal suboxide cations, polyatomic anions and a coordinating species comprising a peroxide group, to form an inorganic patterning composition, wherein the composition comprises Cu, Al, Sc, Ti, V, Cr, Mn, Fe, Co, Ni, Zn, Y, Zr, Nb, Mo, In, Sn, Sb, Hf, Ta, W, Ir, Pt, La, Ce, Pr, Nd, Pm, Sm, Eu, Gd, Tb, Dy, Ho, Er, Tm, Yb, Lu or a combination thereof.

20. The method of claim 19 wherein the coordinating species comprises hydrogen peroxide.

21. The method of claim 19 wherein the polyatomic anions comprise sulfate anions.

22. The method of claim 19 wherein the metal suboxide cations comprise $ZrO^{+2}$ cations, $HfO^{+2}$ cations or a combination thereof, and wherein the polyatomic anions comprise sulfate, phosphate, nitrate, silicate, aluminate, borate or combinations thereof.

23. The method of claim 7 wherein the exposed patterned coating comprises features having a size≦100 nm.

* * * * *